United States Patent
Tang

(10) Patent No.: US 11,728,378 B2
(45) Date of Patent: Aug. 15, 2023

(54) SEMICONDUCTOR DEVICE AND METHOD FOR MANUFACTURING SAME

(71) Applicants: Semiconductor Manufacturing International (Beijing) Corporation, Beijing (CN); Semiconductor Manufacturing International (Shanghai) Corporation, Shanghai (CN)

(72) Inventor: Poren Tang, Beijing (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 78 days.

(21) Appl. No.: 17/210,819

(22) Filed: Mar. 24, 2021

(65) Prior Publication Data

US 2021/0210597 A1     Jul. 8, 2021

Related U.S. Application Data

(62) Division of application No. 16/181,786, filed on Nov. 6, 2018, now Pat. No. 10,991,794.

(30) Foreign Application Priority Data

Dec. 11, 2017  (CN) .......................... 201711306991.6

(51) Int. Cl.
*H01L 29/06*     (2006.01)
*H01L 29/66*     (2006.01)
(Continued)

(52) U.S. Cl.
CPC ...... *H01L 29/0649* (2013.01); *H01L 21/7682* (2013.01); *H01L 29/41775* (2013.01);
(Continued)

(58) Field of Classification Search
None
See application file for complete search history.

(56) References Cited

U.S. PATENT DOCUMENTS 9,608,065 B1   3/2017  Bergendahl et al.
9,716,158 B1   7/2017  Cheng et al.
(Continued)

FOREIGN PATENT DOCUMENTS

CN      103390644 A    11/2013
CN      108231664 A    6/2018
WO      2017/014725 A1  1/2017

*Primary Examiner* — Vincent Wall
(74) *Attorney, Agent, or Firm* — Crowell & Moring, L.L.P.

(57) ABSTRACT

The present specification discloses a semiconductor device and a method for manufacturing same. In one implementation, the method may include: providing a semiconductor structure, wherein the semiconductor structure includes a substrate, a gate structure disposed on the substrate, initial spacer layers on side surfaces of two sides of the gate structure, and a first inter-layer dielectric layer covering the gate structure and the initial spacer layers; and the substrate includes a source and a drain respectively located on the two sides of the gate structure; etching the first inter-layer dielectric layer to form a source contact hole and a drain contact hole that expose a part of the initial spacer layer; removing the exposed part of the initial spacer layer to expose the side surface of the gate structure; forming a spacer structure layer on the exposed side surface of the gate structure; forming a source contact member and a drain contact member in the contact holes; selectively removing at least a part of the spacer structure layer to form an air gap;

(Continued)

and forming a second inter-layer dielectric layer covering the air gap. In the present invention, an air gap spacer structure can be formed and parasitic capacitance is reduced.

6 Claims, 16 Drawing Sheets

(51) Int. Cl.
*H01L 29/417* (2006.01)
*H01L 21/768* (2006.01)
*H01L 29/49* (2006.01)
*H01L 29/78* (2006.01)
*H01L 21/764* (2006.01)

(52) U.S. Cl.
CPC ...... *H01L 29/4991* (2013.01); *H01L 29/6653* (2013.01); *H01L 29/66575* (2013.01); *H01L 21/764* (2013.01); *H01L 29/78* (2013.01)

(56) References Cited

U.S. PATENT DOCUMENTS

| | | |
|---|---|---|
| 2004/0147082 A1 | 7/2004 | Kim |
| 2008/0040697 A1 | 2/2008 | Chidambarrao |
| 2015/0091089 A1 | 4/2015 | Niebojewski et al. |
| 2015/0243544 A1 | 8/2015 | Alptekin |
| 2018/0040734 A1* | 2/2018 | Chang ............... H01L 29/42376 |
| 2018/0082951 A1 | 3/2018 | Li |
| 2018/0166553 A1* | 6/2018 | Lee ................... H01L 29/41766 |

\* cited by examiner

SEMICONDUCTOR DEVICE AND METHOD FOR MANUFACTURING SAME

RELATED APPLICATIONS

The present application is a divisional of U.S. patent application Ser. No. 16/181,786 (still pending), filed Nov. 6, 2018, which claims priority to Chinese Patent Appln. No. 201711306991.6, filed on Dec. 11, 2017, the entire disclosure of each which is hereby incorporated by reference.

BACKGROUND

Technical Field

The present disclosure relates to the field of semiconductor technologies, and in particular, to semiconductor devices and methods for manufacturing same.

Related Art

With the development of metal oxide semiconductor (MOS) processes, the sizes of semiconductor devices are becoming smaller, leading to a smaller distance between a contact member of a source/drain and a gate. Consequently, a parasitic capacitance between the contact member of the source/drain and the gate gradually increases, resulting in degraded device performance. To resolve this problem, an air gap spacer structure is provided in the prior art. That is, an air gap is formed between the contact member of the source/drain and the gate to decrease a dielectric coefficient (a dielectric coefficient of air is smaller than a dielectric coefficient of an original insulation spacer layer) of a dielectric of parasitic capacitance, so as to reduce the parasitic capacitance.

However, the conventional process manufacturing method for forming the air gap spacer structure is complex. In some process manufacturing methods, in a process of forming a gate contact member, because the gate contact member is formed on the air gap, the gate contact member easily enters the air gap and causes an unexpected contact problem. In addition, in the conventional art, as the size of the device gradually becomes smaller, because the distance between the contact member of the source/drain and the gate is small, if the air gap is formed between the contact member of the source/drain and the gate, the contact member of the source/drain is quite likely to be connected to the gate, leading to a short circuit.

SUMMARY

It is found that the foregoing problems exist in the prior art, and therefore a new technical solution to at least one of the problems is provided.

One object of the present disclosure is to provide methods for manufacturing a semiconductor device to form an air gap spacer structure and reduce parasitic capacitance.

In one aspect of some implementations of the present disclosure, a method for manufacturing a semiconductor device is provided. The method may include: providing a semiconductor structure, where the semiconductor structure includes a substrate, a gate structure disposed on the substrate, initial spacer layers on side surfaces of two sides of the gate structure, and a first inter-layer dielectric layer covering the gate structure and the initial spacer layers, wherein the substrate includes a source and a drain respectively located on two sides of the gate structure; etching the first inter-layer dielectric layer to form a source contact hole exposing the source and a drain contact hole exposing the drain, where the source contact hole and the drain contact hole further expose a part of the initial spacer layer on at least one side of the gate structure; removing the exposed part of the initial spacer layer to expose the side surface of the at least one side of the gate structure; forming a spacer structure layer on the exposed side surface of the at least one side of the gate structure; after the spacer structure layer is formed, forming, in the source contact hole, a source contact member connected to the source, and forming, in the drain contact hole, a drain contact member connected to the drain; after the source contact member and the drain contact member are formed, selectively removing at least a part of the spacer structure layer to form an air gap; and forming a second inter-layer dielectric layer on the first inter-layer dielectric layer, the source contact member, and the drain contact member, where the second inter-layer dielectric layer covers the air gap.

In some implementations, in the step of forming the air gap, the air gap is formed between the gate structure and the source contact member or between the gate structure and the drain contact member.

In some implementations, in the step of forming the spacer structure layer, the spacer structure layer includes a sacrificial spacer layer on the at least one side of the gate structure; and the step of selectively removing at least a part of the spacer structure layer to form an air gap includes removing the sacrificial spacer layer to form the air gap.

In some implementations, in the step of forming the spacer structure layer, the sacrificial spacer layer is located on the exposed side surface of the at least one side of the gate structure.

In some implementations, the method further includes before forming a second inter-layer dielectric layer, conformally depositing a gate spacer layer at least on a side wall of the air gap.

In some implementations, in the step of forming the spacer structure layer, the spacer structure layer further includes a first spacer layer between the gate structure and the sacrificial spacer layer, where the first spacer layer is formed on the exposed side surface of the at least one side of the gate structure, and the sacrificial spacer layer is formed on a side surface of the first spacer layer; wherein the material of the sacrificial spacer layer is different from the material of the first spacer layer; and wherein the step of removing the sacrificial spacer layer to form the air gap includes selectively removing the sacrificial spacer layer and maintaining the first spacer layer.

In some implementations, in the step of forming the spacer structure layer, the spacer structure layer further includes a second spacer layer on a side surface of the sacrificial spacer layer, the material of the sacrificial spacer layer being further different from the material of the second spacer layer; and in the step of selectively removing the sacrificial spacer layer, the second spacer layer is further maintained.

In some implementations, the material of the sacrificial spacer layer includes SiON, SiOCN, amorphous silicon, or polysilicon.

In some implementations, the materials of the first spacer layer and the second spacer layer respectively include SiN, SiON, or SiOCN; and the material of the sacrificial spacer layer includes polysilicon or amorphous silicon.

In some implementations, the at least one side of the gate structure includes the two sides of the gate structure.

In some implementations, the step of forming the second inter-layer dielectric layer includes non-conformally depositing the second inter-layer dielectric layer on the first inter-layer dielectric layer, the source contact member, and the drain contact member.

In some implementations, in the step of providing the semiconductor structure, the gate structure includes a gate insulation material layer on the substrate, a gate layer on the gate insulation material layer, and a hard mask layer on the gate layer; and the first inter-layer dielectric layer is etched in self-alignment using the initial spacer layer to form the source contact hole and the drain contact hole.

In some implementations, the method further includes forming a gate contact member running through the second inter-layer dielectric layer, the first inter-layer dielectric layer, and the hard mask layer and connected to the gate layer, where the gate contact member is spaced apart from the air gap in a horizontal direction.

In some implementations of the foregoing manufacturing method, the air gap is formed between the gate structure and the source contact member or between the gate structure and the drain contact member, so that the air gap spacer structure is formed and parasitic capacitance is reduced.

Further, because in a process of forming the source contact hole and the drain contact hole, etching may be performed on the first inter-layer dielectric layer using a self-aligned etching process, methods for manufacturing a semiconductor device according to forms of the present disclosure may further be compatible with the self-aligned etching process, thereby reducing the process complexity.

Further, the gate spacer layers may be formed on side surfaces of the gate structure and the source contact member or the drain contact member; or the first spacer layer is formed on the side surface of the gate structure; or the first spacer layer is formed on the side surface of the gate structure and the second spacer layer is formed on the side surface of the source contact member or the drain contact member. Such designs may avoid a potential short circuit connection caused by the gate layer and the source contact member or the drain contact member through exposure to the air gap.

Further, the gate contact member is spaced apart from the air gap in the horizontal direction, and the gate contact member is not formed right above the air gap. Therefore, the gate contact member is unlikely to enter the air gap and lead to an unexpected gate defect.

In another aspect of implementations of the present disclosure, further methods for manufacturing a semiconductor device are provided. The methods may include: providing a semiconductor structure, where the semiconductor structure includes a substrate, a gate structure disposed on the substrate, first initial spacer layers on side surfaces of two sides of the gate structure, second initial spacer layers on side surfaces of the first initial spacer layers, and a first inter-layer dielectric layer covering the gate structure, the first initial spacer layers, and the second initial spacer layers, the substrate including a source and a drain respectively located on two sides of the gate structure, wherein the material of the first initial spacer layer is different from the material of the second initial spacer layer; etching the first inter-layer dielectric layer to form a source contact hole exposing the source and a drain contact hole exposing the drain, where the source contact hole and the drain contact hole further expose a part of the second initial spacer layer on the side surface of the first initial spacer layer on at least one side of the gate structure; removing the exposed part of the second initial spacer layer to expose the side surface of the first initial spacer layer; forming a spacer structure layer on the exposed side surface of the first initial spacer layer; after the spacer structure layer is formed, forming, in the source contact hole, a source contact member connected to the source, and forming, in the drain contact hole, a drain contact member connected to the drain; after the source contact member and the drain contact member are formed, selectively removing at least a part of the spacer structure layer to form an air gap; and forming a second inter-layer dielectric layer on the first inter-layer dielectric layer, the source contact member, and the drain contact member, where the second inter-layer dielectric layer covers the air gap.

In some implementations, in the step of forming the spacer structure layer, the spacer structure layer includes a sacrificial spacer layer on the exposed side surface of the first initial spacer layer; and the step of selectively removing at least a part of the spacer structure layer to form an air gap includes removing the sacrificial spacer layer to form the air gap.

In some implementations, the method further includes before forming a second inter-layer dielectric layer, conformally depositing a gate spacer layer at least on a side wall of the air gap.

In some implementations, in the step of forming the spacer structure layer, the spacer structure layer includes a first spacer layer on the exposed side surface of the first initial spacer layer and a sacrificial spacer layer on a side surface of the first spacer layer, where the material of the sacrificial spacer layer is different from the material of the first spacer layer; and the step of selectively removing at least a part of the spacer structure layer to form an air gap includes selectively removing the sacrificial spacer layer and maintaining the first spacer layer.

In some implementations, in the step of forming the spacer structure layer, the spacer structure layer further includes a second spacer layer on a side surface of the sacrificial spacer layer, the material of the sacrificial spacer layer being further different from the material of the second spacer layer; and in the step of selectively removing the sacrificial spacer layer, the second spacer layer is further maintained.

In implementations of the foregoing manufacturing methods, the air gap is formed between the gate structure and the source contact member or between the gate structure and the drain contact member, so that the air gap spacer structure is formed and parasitic capacitance is reduced. In addition, because one side of the air gap has the first initial spacer layer, a problem that the gate layer is in short circuit connection with the source contact member or the drain contact member may be avoided.

In another aspect of implementations of the present disclosure, a semiconductor device is provided. The semiconductor device may include: a substrate, including a source and a drain; a gate structure disposed on the substrate, where the source and the drain are respectively located on two sides of the gate structure; a first inter-layer dielectric layer covering the gate structure; a source contact hole running through the first inter-layer dielectric layer and exposing the source and a drain contact hole running through the first inter-layer dielectric layer and exposing the drain; a source contact member connected to the source in the source contact hole and a drain contact member connected to the drain in the drain contact hole; an air gap between the gate structure and the source contact member or between the gate structure and the drain contact member, where side walls of the air gap are a side wall of the gate structure and a side wall of the source contact member or a side wall of the gate structure and a side wall of the drain contact member; and a second inter-layer dielectric layer on the first inter-layer dielectric layer, the source contact member, and the drain contact member, where the second inter-layer dielectric layer covers the air gap.

In some implementations, the semiconductor device further includes a gate spacer layer at least on a side wall of the air gap.

In some implementations, the gate structure includes a gate insulation material layer on the substrate, a gate layer on the gate insulation material layer, and a hard mask layer on the gate layer; and the semiconductor device further includes a gate contact member running through the second inter-layer dielectric layer, the first inter-layer dielectric layer, and the hard mask layer and connected to the gate layer, the gate contact member being spaced apart from the air gap in a horizontal direction.

In some implementations of the foregoing semiconductor device, the air gap is formed between the gate structure and the source contact member or between the gate structure and the drain contact member, so that parasitic capacitance can be reduced.

Further, the semiconductor device may further include the gate spacer layer at least on a side wall of the air gap. In this way, a potential short circuit connection caused by that the gate layer and the source contact member or the drain contact member through exposure to the air gap may be avoided.

Further, the gate contact member is spaced apart from the air gap in the horizontal direction, and the gate contact member is not formed right above the air gap. Therefore, the gate contact member is unlikely to enter the air gap and lead to an unexpected gate defect.

In yet a further aspect of implementations of the present disclosure, a semiconductor device is provided, including: a substrate, including a source and a drain; a gate structure disposed on the substrate, where the source and the drain are respectively located on two sides of the gate structure; a first spacer layer on a side surface of the gate structure; a first inter-layer dielectric layer covering the gate structure; a source contact hole running through the first inter-layer dielectric layer and exposing the source and a drain contact hole running through the first inter-layer dielectric layer and exposing the drain; a source contact member connected to the source in the source contact hole and a drain contact member connected to the drain in the drain contact hole; an air gap between the first spacer layer and the source contact member or between the first spacer layer and the drain contact member; and a second inter-layer dielectric layer on the first inter-layer dielectric layer, the source contact member, and the drain contact member, where the second inter-layer dielectric layer covers the air gap.

In some implementations, the semiconductor device further includes a second spacer layer on a side surface of the source contact member or a side surface of the drain contact member, where the air gap is between the first spacer layer and the second spacer layer.

In some implementations, the gate structure includes a gate insulation material layer on the substrate, a gate layer on the gate insulation material layer, and a hard mask layer on the gate layer; and the semiconductor device further includes a gate contact member running through the second inter-layer dielectric layer, the first inter-layer dielectric layer, and the hard mask layer and connected to the gate layer, the gate contact member being spaced apart from the air gap in a horizontal direction.

In some implementations of the foregoing semiconductor device, the air gap is formed between the gate structure and the source contact member or between the gate structure and the drain contact member, so that parasitic capacitance can be reduced. The first spacer layer is formed on the side surface of the gate structure. In this way, a potential short circuit connection caused by the gate layer and the source contact member or the drain contact member through exposure to the air gap may be avoided.

Further, the gate contact member is spaced apart from the air gap in the horizontal direction, and the gate contact member is not formed right above the air gap. Therefore, the gate contact member is unlikely to enter the air gap and lead to an unexpected gate defect.

In yet another aspect of implementations of the present disclosure, another semiconductor device is provided. The semiconductor device may include a source and a drain; a gate structure disposed on the substrate, where the source and the drain are respectively located on two sides of the gate structure; a first initial spacer layer on a side surface of the gate structure; a first inter-layer dielectric layer covering the gate structure; a source contact hole running through the first inter-layer dielectric layer and exposing the source and a drain contact hole running through the first inter-layer dielectric layer and exposing the drain; a source contact member connected to the source in the source contact hole and a drain contact member connected to the drain in the drain contact hole; an air gap between the first initial spacer layer and the source contact member or between the first initial spacer layer and the drain contact member; and a second inter-layer dielectric layer on the first inter-layer dielectric layer, the source contact member, and the drain contact member, where the second inter-layer dielectric layer covers the air gap.

In some implementations of the foregoing semiconductor device, the air gap is formed between the gate structure and the source contact member or between the gate structure and the drain contact member, so that an air gap spacer structure is formed and parasitic capacitance is reduced. In addition, because one side of the air gap has the first initial spacer layer, a problem that the gate layer is in short circuit connection with the source contact member or the drain contact member may be avoided.

Exemplary embodiments and implementations of the present disclosure are described in detail with reference to the accompanying drawings, and other features and advantages of the present disclosure become more clear.

BRIEF DESCRIPTION OF THE DRAWINGS

The accompanying drawings forming a part of the specification illustrate embodiments and implementations of the present disclosure, and are used together with the specification to explain the principles of the present disclosure.

Referring to the accompanying drawings, the present disclosure can be understood more clearly according to the detailed description below, where.

DETAILED DESCRIPTION

Various exemplary embodiments and implementations of the present disclosure are described in detail with reference to the accompanying drawings herein. It should be noted that, unless otherwise specifically stated, the relative arrangement of components and steps, numerical expressions, and values described in these embodiments and implementations do not limit the scope of the present disclosure.

In addition, it should be understood that, for ease of description, the sizes of various parts shown in the accompanying drawings are not drawn according to an actual proportional relation.

The following description of at least one exemplary embodiment is merely illustrative and in no way serves as a limitation to the invention and application or use thereof.

Technologies, methods, and devices known to a person of ordinary skill in the related art may not be discussed in detail, but the technologies, methods, and devices should be considered as a part of the authorized specification in appropriate cases.

In all of the examples shown and discussed herein, any specific value should be interpreted merely as an example, rather than a limitation. Therefore, other examples of the exemplary embodiments and implementations may have different values.

It should be noted that, similar reference numbers and letters represent similar terms in the following accompanying drawings, and therefore, an item does not need to be further discussed in subsequent accompanying drawings once the item is defined in an accompanying drawing.

Figure 1:
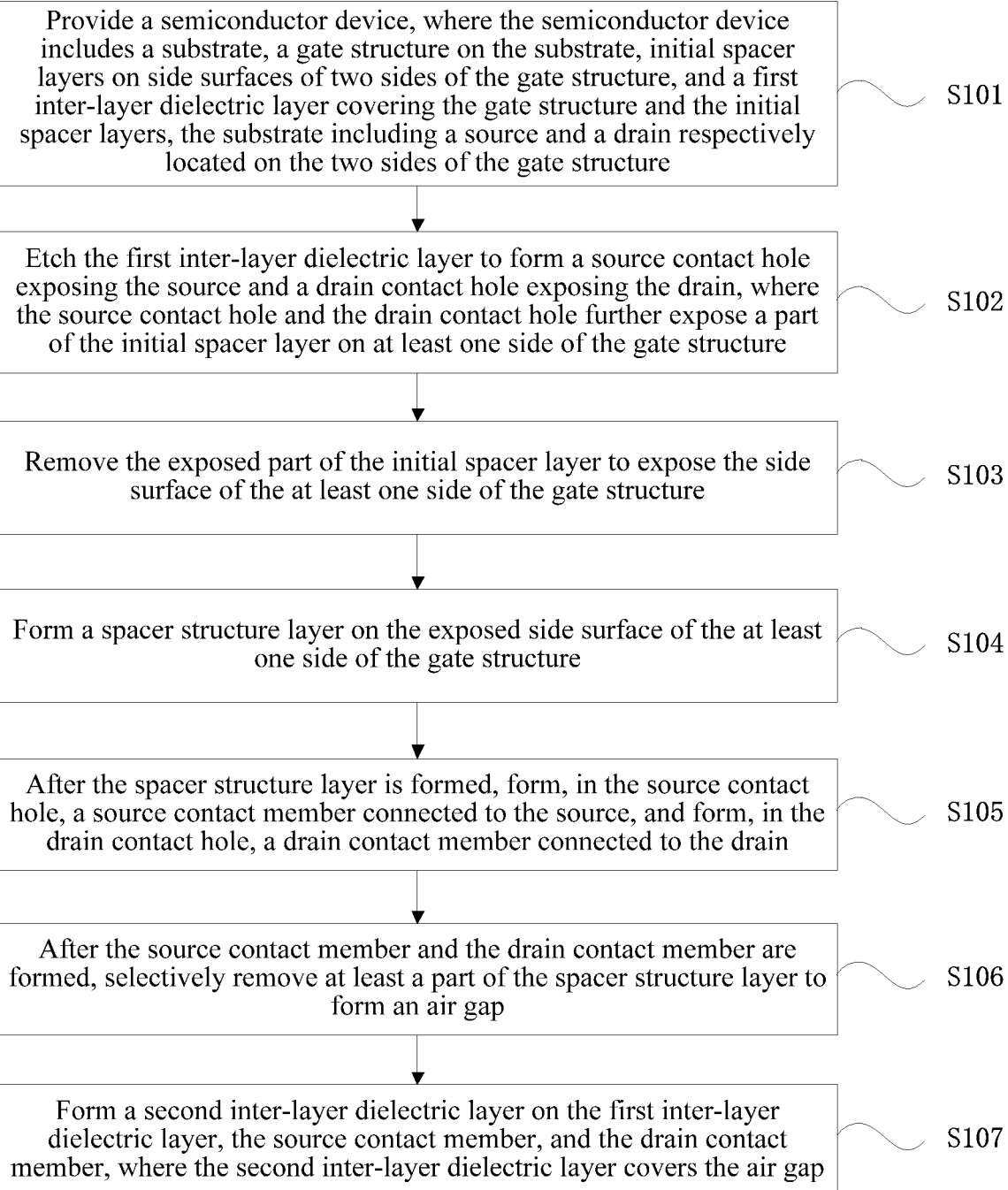
FIG. 1 is a flowchart of a method for manufacturing a semiconductor device according to one form of the present disclosure.

FIG. 1 is a flowchart of a method for manufacturing a semiconductor device according to one form of the present disclosure. FIG. 2 to FIG. 9 are exemplary cross-sectional views of structures in several stages of a process of manufacturing the semiconductor device according to one form of the present invention. A process of manufacturing a semiconductor device according to one form of the present disclosure is described in detail below with reference to FIG. 1 and FIG. 2 to FIG. 9.

As shown in FIG. 1, in step S101, a semiconductor structure is provided. The semiconductor structure includes: a substrate, a gate structure on the substrate, initial spacer layers on side surfaces of two sides of the gate structure, and a first inter-layer dielectric layer covering the gate structure and the initial spacer layers, where the substrate includes a source and a drain respectively located on the two sides of the gate structure.

Figure 2:
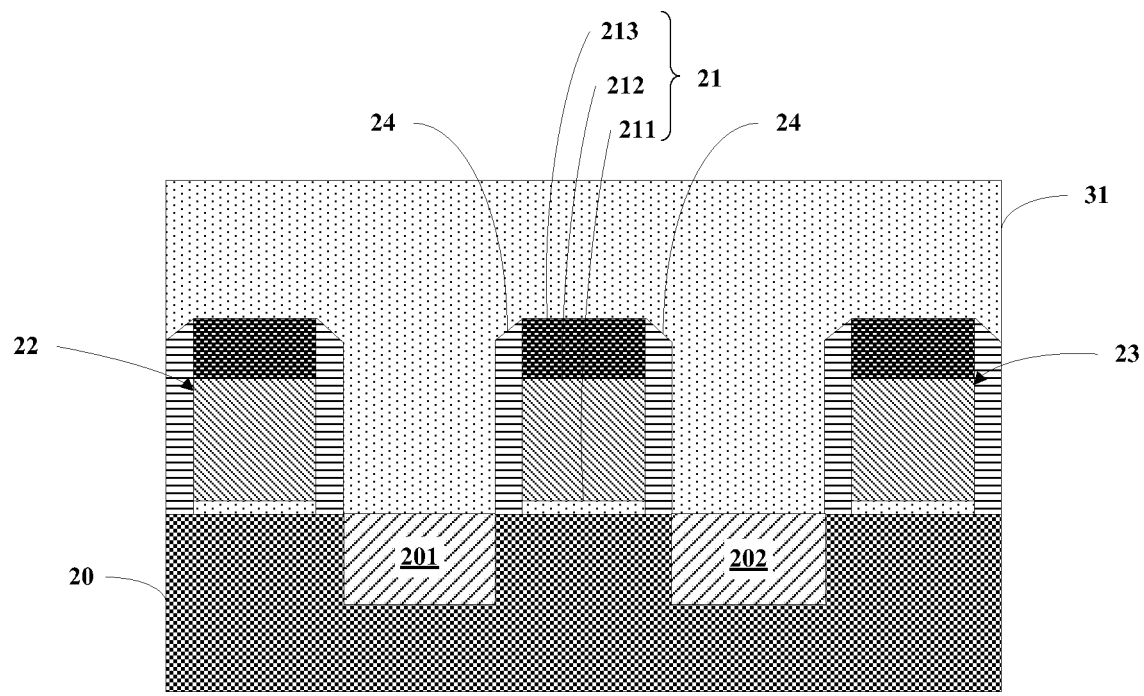
FIG. 2 is an exemplary cross-sectional view of a structure in a stage of a process of manufacturing a semiconductor device.

FIG. 2 is an exemplary cross-sectional view of a structure in step S101 in a process of manufacturing the semiconductor device. As shown in FIG. 2, a semiconductor structure is provided. The semiconductor structure may include a substrate 20, a gate structure 21 (or 22 or 23) on the substrate 20, initial spacer layers 24 on side surfaces of two sides of the gate structure 21 (or 22 or 23), and a first inter-layer dielectric layer 31 covering the gate structure and the initial spacer layers 24. The substrate 20 may include a source 201 and a drain 202 respectively located on the two sides of the gate structure 21. For example, the substrate 20 may be a semiconductor substrate such as a silicon substrate. The material of the initial spacer layer 24 may include silicon oxide and/or silicon nitride (SiN) and/or the like. The material of the first inter-layer dielectric layer may include silicon oxide and/or the like.

In some implementations, in step S101, the gate structure 21 (or 22 or 23) may include a gate insulation material layer 211 on the substrate 20, a gate layer 212 on the gate insulation material layer 211, and a hard mask layer 213 on the gate layer 212. For example, the material of the gate insulation material layer 211 may include silicon oxide and/or a high-k (a dielectric coefficient) dielectric layer (for example, hafnium dioxide ($HfO_2$)) and/or the like. The material of the gate layer 212 may include metal or polysilicon, for example, titanium nitride and tungsten. The material of the hard mask layer 213 may include SiN and the like.

In some implementations, the step of providing a semiconductor structure may include forming the gate structure on the substrate, and forming the initial spacer layers on the side surfaces of the two sides of the gate structure; and then depositing the first inter-layer dielectric layer, and planarization (for example, chemical mechanical planarization (CMP)) is performed on the first inter-layer dielectric layer.

It should be noted that, although FIG. 2 shows three gate structures: gate structures 21, 22 and 23 (for example, which may be respectively referred to as a first gate structure 21, a second gate structure 22, and a third gate structure 23), a person skilled in the art should understand that in the present disclosure, the semiconductor structure may include one, two, or more than three gate structures. Therefore, the scope of the present disclosure is not merely limited to the number of the gate structures shown herein, and the following schematic diagrams have similar definitions.

Returning to FIG. 1, in step S102, the first inter-layer dielectric layer is etched to form a source contact hole exposing the source and a drain contact hole exposing the drain. The source contact hole and the drain contact hole further expose a part of the initial spacer layer on at least one side of the gate structure.

Figure 3:
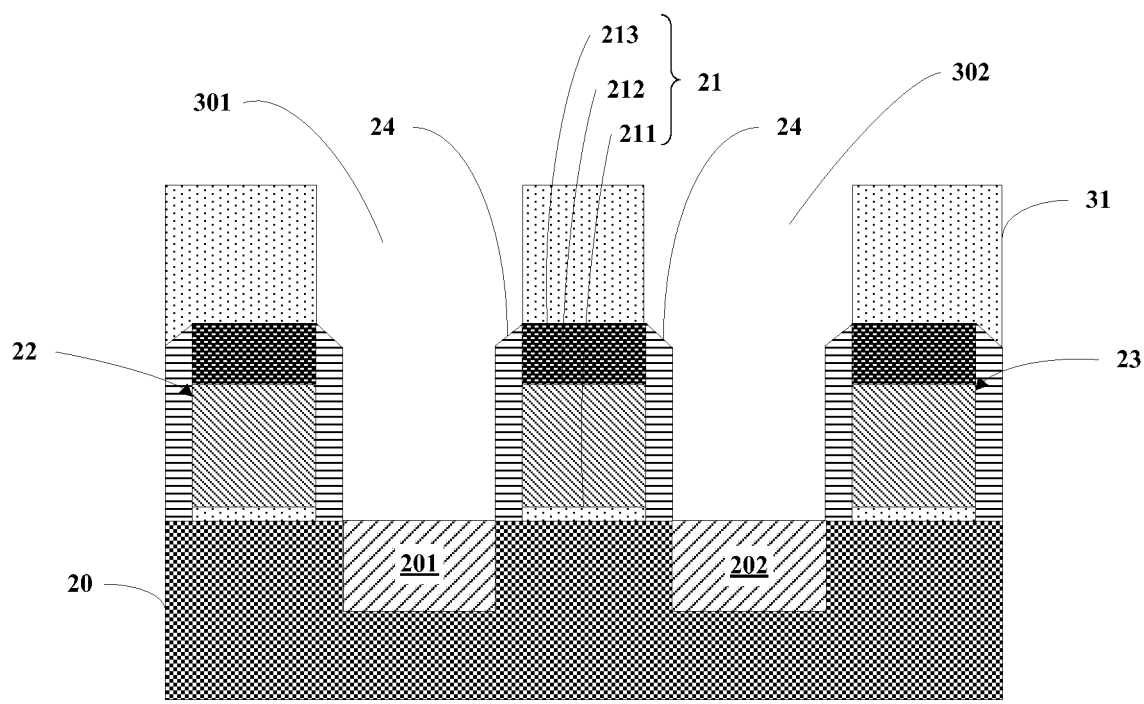
FIG. 3 is an exemplary cross-sectional view of a structure in a stage of a process of manufacturing a semiconductor device.

FIG. 3 is an exemplary cross-sectional view of a structure in step S102 in a process of manufacturing the semiconductor device. As shown in FIG. 3, the first inter-layer dielectric layer 31 is etched to form a source contact hole 301 exposing the source 201 and a drain contact hole 302 exposing the drain 202. The source contact hole 301 and the drain contact hole 302 may further expose a part of the initial spacer layer 24 on at least one side of the gate structure 21 (or 22 or 23). The at least one side of the gate structure may include two sides of the gate structure. For example, the source contact hole 301 and the drain contact hole 302 expose a part of the initial spacer layers 24 on the two sides of the gate structure 21. In another example, the source contact hole 301 exposes a part of the initial spacer layer 24 on a side of the gate structure 22 and the drain contact hole 302 exposes a part of the initial spacer layer 24 on a side of the gate structure 23.

In some implementations, the first inter-layer dielectric layer 31 is etched in self-alignment by using the initial spacer layer 24 to form the source contact hole 301 and the drain contact hole 302.

Returning to FIG. 1, in step S103, the exposed part of the initial spacer layer is removed to expose the side surface of the at least one side of the gate structure.

Figure 4:
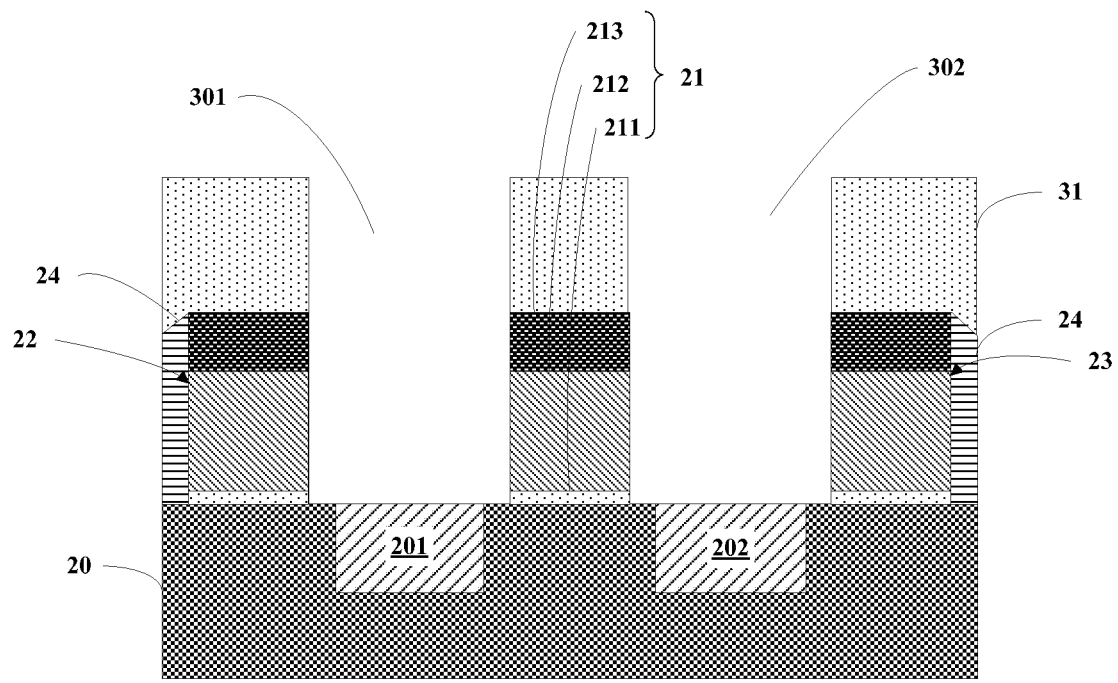
FIG. 4 is an exemplary cross-sectional view of a structure in a stage of a process of manufacturing a semiconductor device.

FIG. 4 is an exemplary cross-sectional view of a structure in step S103 in a process of manufacturing the semiconductor device. As shown in FIG. 4, for example, the exposed part of the initial spacer layer 24 is removed using an etching process to expose the side surface of the at least one side of the gate structure. For example, after the exposed parts of the initial spacer layers 24 are removed, the side surfaces of the two sides of the gate structure 21, a side surface of one side of the gate structure 22, and a side surface of one side of the gate structure 23 are exposed.

Returning to FIG. 1, in step S104, a spacer structure layer is formed on the exposed side surface of the at least one side of the gate structure. In some implementations, the spacer structure layer may include a sacrificial spacer layer on the at least one side of the gate structure. For example, the sacrificial spacer layer may be located on the exposed side surface of the at leaser one side of the gate structure.

Figure 5:
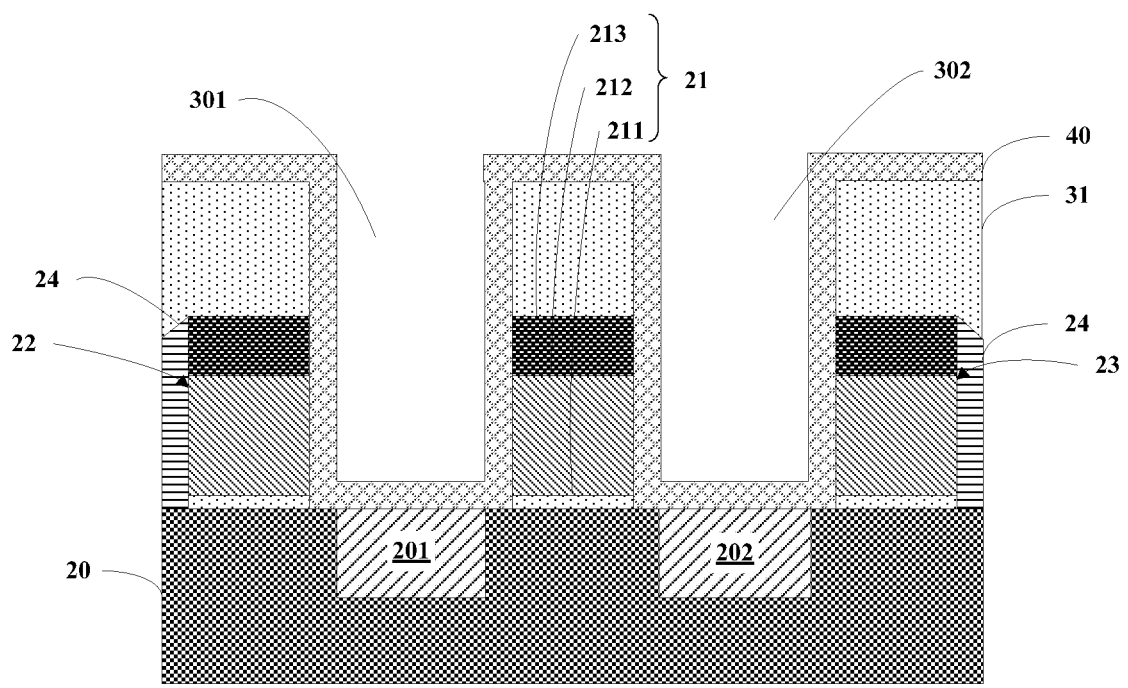
FIG. 5 is an exemplary cross-sectional view of a structure in a stage of a process of manufacturing a semiconductor device.
Figure 6:
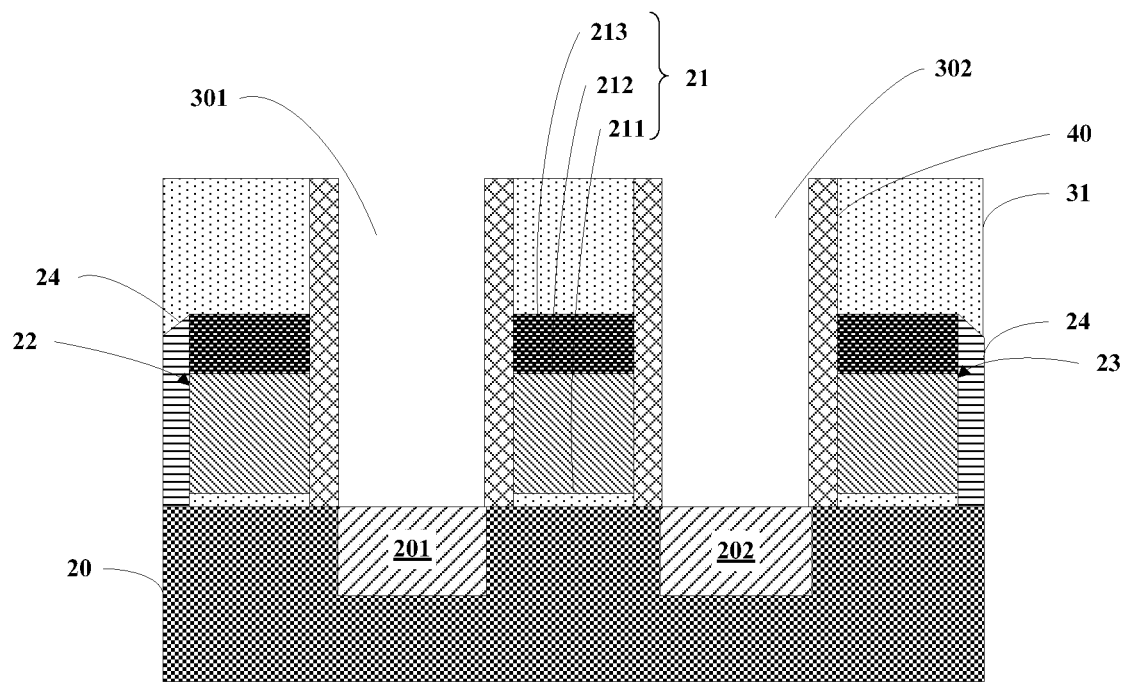
FIG. 6 is an exemplary cross-sectional view of a structure in a stage of a process of manufacturing a semiconductor device.

FIG. 5 and FIG. 6 are exemplary cross-sectional views of structures in two stages in step S104 in a process of manufacturing the semiconductor device. As shown in FIG. 5, for example, a spacer structure layer may be formed on the exposed side surfaces of the two sides of the gate structure 21, a side surface of one side of the gate structure 22, and a side surface of one side of the gate structure 23 by using a depositing process. The spacer structure layer may include a sacrificial spacer layer 40 on the at least one side of the gate structure. For example, the material of the sacrificial spacer layer 40 may include silicon oxynitride (SiON), silicon oxycarbon nitride (SiOCN), amorphous silicon, polysilicon, or the like. The spacer structure layer (the sacrificial spacer layer 40 herein) is further formed on the bottoms of the source contact hole 301 and the drain contact hole 302, and on a top surface of the first inter-layer dielectric layer 31.

Subsequently, as shown in FIG. 6, for example, the spacer structure layer may be etched by using a dry etching process to remove a part of the spacer structure layer on the bottoms of the source contact hole 301 and the drain contact hole 302, and on the top surface of the first inter-layer dielectric layer 31 (a part of the sacrificial spacer layer 40 being removed in this embodiment), and a part of the spacer structure layer on side walls of the source contact hole and the drain contact hole is maintained, so as to form the spacer structure layer on the exposed side surface of the at least one side of the gate structure.

Returning to FIG. 1, in step S105, after the spacer structure layer is formed, a source contact member connected to the source is formed in the source contact hole, and a drain contact member connected to the drain is formed in the drain contact hole.

Figure 7:
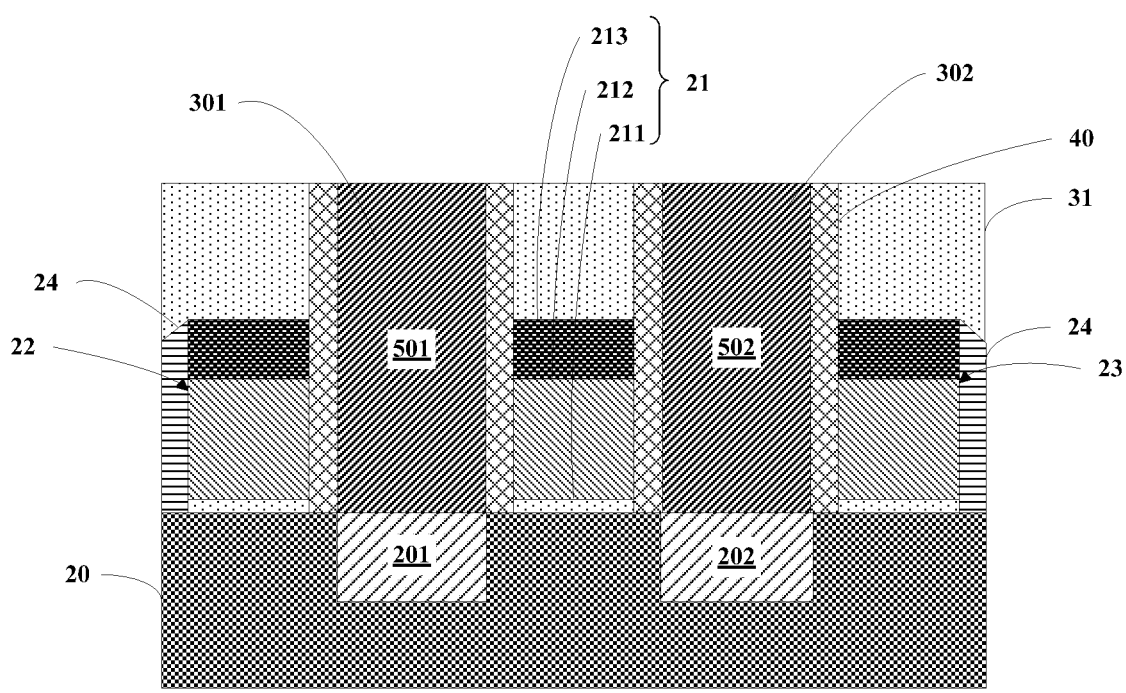
FIG. 7 is an exemplary cross-sectional view of a structure in a stage of a process of manufacturing a semiconductor device.

FIG. 7 is an exemplary cross-sectional view of a structure in step S105 in a process of manufacturing the semiconductor device. As shown in FIG. 7, for example, metal contact layers (for example, metal such as tungsten or copper) are filled in the source contact hole and the drain contact hole by using a process such as depositing. Planarization (for example, CMP) is then performed on the metal contact layers to form a source contact member 501 connected to the source 201 in the source contact hole 301, and a drain contact member 502 connected to the drain 202 in the drain contact hole 302.

Returning to FIG. 1, in step S106, after the source contact member and the drain contact member are formed, at least a part of the spacer structure layer is selectively removed to form an air gap.

Figure 8:
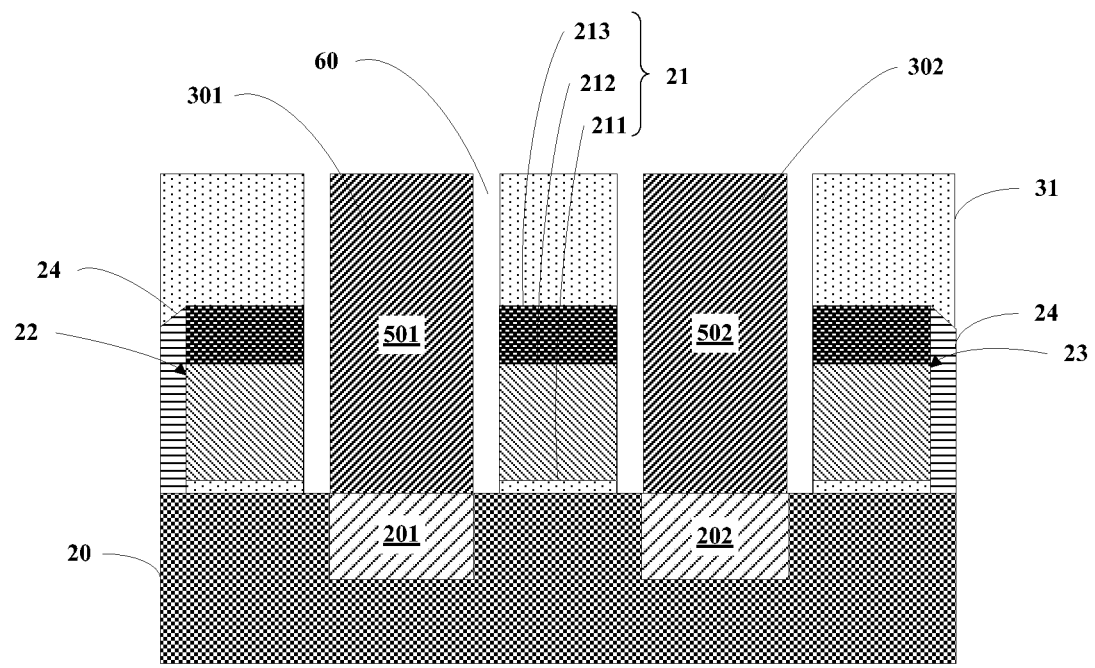
FIG. 8 is an exemplary cross-sectional view of a structure in a stage of a process of manufacturing a semiconductor device.

FIG. 8 is an exemplary cross-sectional view of a structure in step S106 in a process of manufacturing the semiconductor device. As shown in FIG. 8, in the step of selectively removing at least a part of the spacer structure layer, the sacrificial spacer layer 40 is removed to form an air gap 60. In some implementations, because the spacer structure layer includes only one layer of sacrificial spacer layer, the selectively removing at least a part of the spacer structure layer herein indicates that the entire sacrificial spacer layer is removed. After the sacrificial spacer layer is removed, side walls of the air gaps 60 are side walls of the gate structure 21 (or 22 or 23), the source contact member 501, and the drain contact member 502, as shown in FIG. 8. In the step of forming the air gap 60, the air gap 60 is formed between the gate structure 21 (or 22) and the source contact member 501, or between the gate structure 21 (or 23) and the drain contact member 502. In some implementations, the width of the air gap is in a range of 5 nm to 25 nm. For example, the width of the air gap may be 10 nm, 15 nm, and 20 nm.

Returning to FIG. 1, in step S107, a second inter-layer dielectric layer is formed on the first inter-layer dielectric layer, the source contact member, and the drain contact member, where the second inter-layer dielectric layer covers the air gap.

Figure 9:
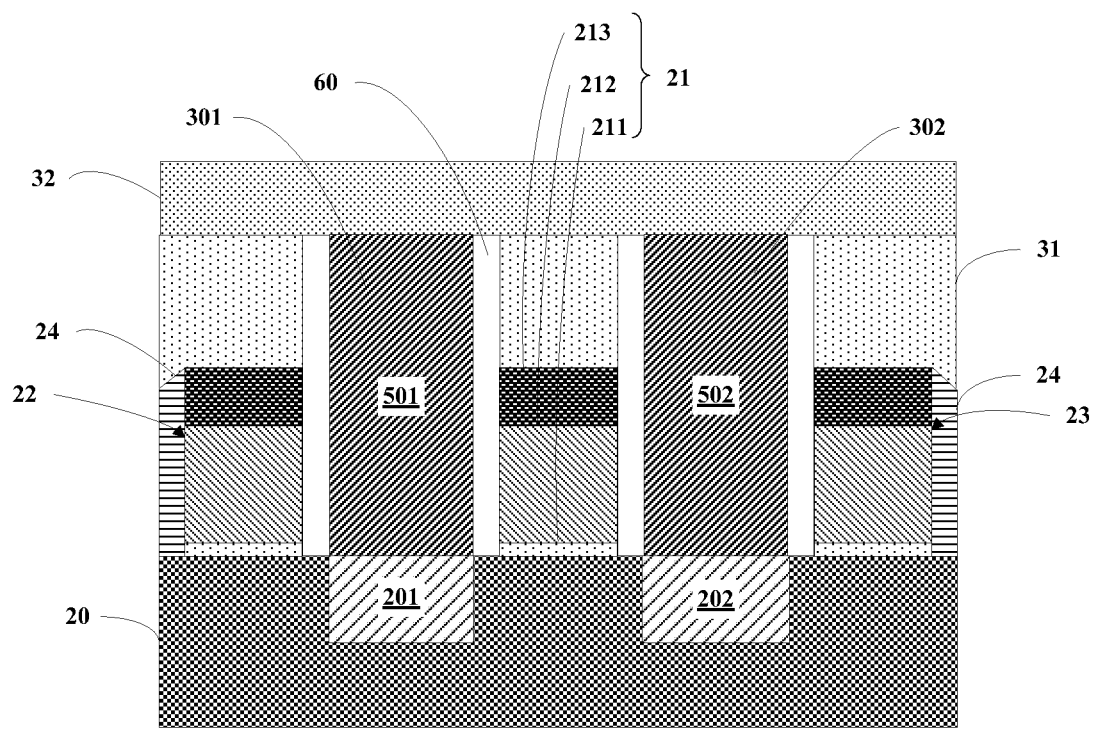
FIG. 9 is an exemplary cross-sectional view of a structure in a stage of a process of manufacturing a semiconductor device.

FIG. 9 is an exemplary cross-sectional view of a structure in step S107 in a process of manufacturing the semiconductor device. As shown in FIG. 9, a second inter-layer dielectric layer 32 is formed on the first inter-layer dielectric layer 31, the source contact member 501, and the drain contact member 502. The material of the second inter-layer dielectric layer 32 may include silicon oxide and the like. For example, the second inter-layer dielectric layer 32 may be non-conformally (or non-uniformly) deposited on the first inter-layer dielectric layer 31, the source contact member 501, and the drain contact member 502 by using a chemical vapor deposition (CVD) process. The second inter-layer dielectric layer 32 is not filled in the air gap 60. Further, after the second inter-layer dielectric layer is formed, planarization (for example, CMP) may further be performed on the second inter-layer dielectric layer.

Hereto, forms of a method for manufacturing a semiconductor device according are provided. In implementations of the manufacturing method, the air gap is formed between the gate structure and the source contact member or between the gate structure and the drain contact member, so that the air gap spacer structure is formed and parasitic capacitance is reduced. Further, because only the air gap and no other dielectric spacer layers exists between the gate structure and the source contact member or between the gate structure and the drain contact member, a dielectric coefficient of the parasitic capacitance is enabled to be small, so as to further reduce the parasitic capacitance.

Further, because in a process of forming the source contact hole and the drain contact hole, etching may be performed on the first inter-layer dielectric layer by using a self-aligned etching process, the method for manufacturing a semiconductor device according to forms of the present disclosure may further be compatible with the self-aligned etching process, thereby reducing the process complexity.

In some implementations, the foregoing manufacturing method may further include forming a gate contact member running through the second inter-layer dielectric layer, the first inter-layer dielectric layer, and the hard mask layer and connected to the gate layer, where the gate contact member is spaced apart from the air gap in a horizontal direction (which is described in detail below with reference to FIG. 22A to FIG. 22C). Because the gate contact member is spaced apart from the air gap in a horizontal direction, the gate contact member cannot enter the air gap. This addresses a problem that a potential gate defect (for example, a short circuit resulted from contact between a gate and other structures) resulted from that the gate contact member enters the air gap.

As a result of implementations of the foregoing manufacturing methods, a semiconductor device is formed according some forms of the present disclosure. For example, as shown in FIG. 9, the semiconductor device may include the substrate 20 and the substrate 20 may include the source 201 and the drain 202. The semiconductor device may further include the gate structure 21 on the substrate 20, where the source 201 and the drain 202 are respectively located on two sides of the gate structure 21. The semiconductor device may further include the first inter-layer dielectric layer 31 covering the gate structure 21; the source contact hole 301 running through the first inter-layer dielectric layer 31 and exposing the source 201 and the drain contact hole 302 running through the first inter-layer dielectric layer 31 and exposing the drain 202; and the source contact member 501 connected to the source 201 in the source contact hole 301 and the drain contact member 502 connected to the drain 202 in the drain contact hole 302. The semiconductor device may further include the air gap 60 between the gate structure 21 and the source contact member 501 or between the gate structure 21 and the drain contact member 502. Side walls of the air gap 60 are a side wall of the gate structure 21 and a side wall of the source contact member 501 or a side wall of the gate structure 21 and a side wall of the drain contact member 502. The semiconductor device may further include the second inter-layer dielectric layer 32 on the first inter-layer dielectric layer 31, the source contact member 501, and the drain contact member 502, where the second inter-layer dielectric layer 32 covers the air gap 60 to enclose the air gap 60.

In some implementations, as shown in FIG. 9, the semiconductor device may further include the gate structures 22 and 23 on the substrate 20. The gate structures 22 and 23 are respectively located on the two sides of the gate structure 21. The air gaps 60 are also formed between the gate structure 22 and the source contact member 501 and between the gate structure 23 and the drain contact member 502. The semiconductor device may further include an initial spacer layer 24 on a side surface of a side that is of the gate structure 22 and that is opposite to a side where the air gap is and an initial spacer layer 24 on a side surface of a side that is of the gate structure 23 and that is opposite to a side where the air gap is.

In some implementations, as shown in FIG. 9, the gate structure 21 (or 22 or 23) may include the gate insulation material layer 211 on the substrate 20, the gate layer 212 on the gate insulation material layer 211, and the hard mask layer 213 on the gate layer 212.

In some implementations, the semiconductor device may further include a gate contact member running through the second inter-layer dielectric layer, the first inter-layer dielectric layer, and the hard mask layer and connected to the gate layer, where the gate contact member is spaced apart from the air gap in a horizontal direction (which is not shown in FIG. 9 and is described in detail below with reference to FIG. 22A to FIG. 22C).

In the foregoing description, a semiconductor device according to forms of the present disclosure is provided. In the semiconductor device, the air gap is formed between the gate structure and the source contact member or between the gate structure and the drain contact member. Further, because only the air gap and no other dielectric spacer layers exists between the gate structure and the source contact member or between the gate structure and the drain contact member, a dielectric coefficient of the parasitic capacitance is small, so as to reduce the parasitic capacitance.

In some implementations of the present disclosure, before the forming a second inter-layer dielectric layer, the foregoing manufacturing method may further include conformally depositing a gate spacer layer at least on a side wall of the air gap.

Figure 10:
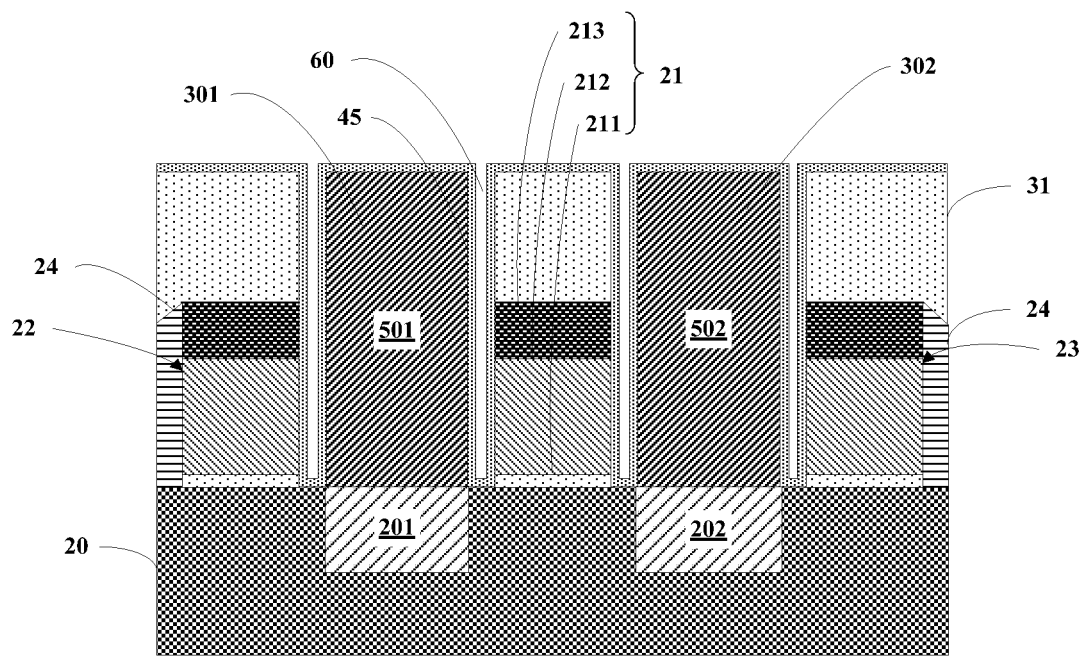
FIG. 10 is an exemplary cross-sectional view of a structure in a stage of a process of manufacturing a semiconductor device.
Figure 11:
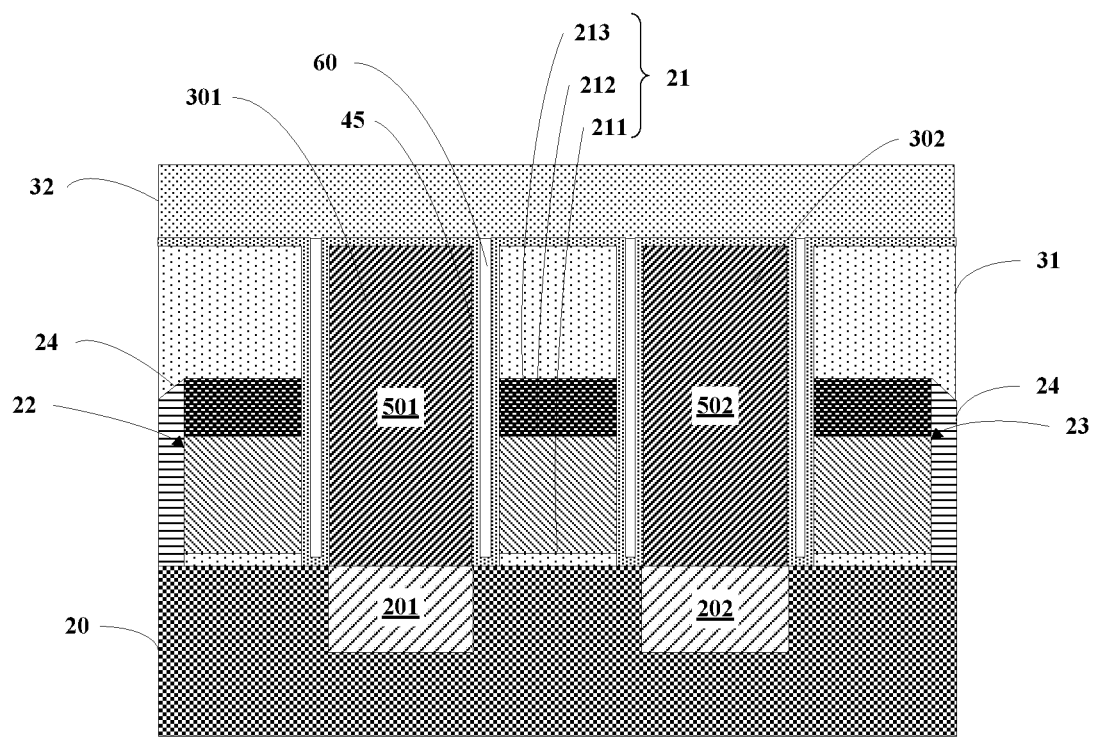
FIG. 11 is an exemplary cross-sectional view of a structure in a stage of a process of manufacturing a semiconductor device.

FIG. 10 and FIG. 11 are exemplary cross-sectional views of structures in several stages of a process of manufacturing the semiconductor device. The process of manufacturing the semiconductor device according to other implementations of the present disclosure is described in detail below with reference to FIG. 10 and FIG. 11.

In some implementations, after the air gap (referring to FIG. 8) is formed, as shown in FIG. 10, a gate spacer layer 45 is conformally (or uniformly) deposited at least on a side wall of the air gap 60 using, for example, an atomic layer deposition process. In this way, the width of the air gap becomes narrow and the narrowed air gaps are located between different parts of the gate spacer layer. For example, the material of the gate spacer layer 45 may include SiOCN, SiN, SiON, or the like. For example, the gate spacer layer 45 may also be formed on the bottom of the air gap 60 and top surfaces of the first inter-layer dielectric layer 31, the source contact member 501, and the drain contact member 502. In some implementations, after the gate spacer layer is deposited, a part of the gate spacer layer on the top surfaces of the first inter-layer dielectric layer 31, the source contact member 501, and the drain contact member 502 may be removed by using the dry etching process.

Subsequently, as shown in FIG. 11, for example, a second inter-layer dielectric layer 32 is non-conformally (or non-uniformly) deposited on the gate spacer layer 45 on the first inter-layer dielectric layer 31, the source contact member 501, and the drain contact member 502 by using a CVD process. In some implementations, if a part of the gate spacer layer on the top surfaces of the first inter-layer dielectric layer 31, the source contact member 501, and the drain contact member 502 is removed in the foregoing step, the second inter-layer dielectric layer 32 can be directly formed on the first inter-layer dielectric layer 31, the source contact member 501, and the drain contact member 502.

Above, forms of a method for manufacturing a semiconductor device is provided. In the forms of the manufacturing method, the gate spacer layer may be formed on the side wall of the air gap. In this way, a potential short circuit connection caused by that the gate layer and the source contact member or the drain contact member are exposed by the air gap may be avoided as far as possible.

In some implementations, the foregoing manufacturing method may further include forming a gate contact member running through the second inter-layer dielectric layer, the first inter-layer dielectric layer, and the hard mask layer and connected to the gate layer, where the gate contact member is spaced apart from the air gap in a horizontal direction (which is described in detail below with reference to FIG. 22A to FIG. 22C). Because the gate contact member is spaced apart from the air gap in a horizontal direction, the gate contact member cannot enter the air gap. This addresses a problem that a potential gate defect (for example, a short circuit resulted from contact between a gate and other structures) resulted from that the gate contact member enters the air gap.

As a result of implementations of the foregoing manufacturing method, a semiconductor device is formed. As shown in FIG. 11, the semiconductor device may include the substrate 20 and the substrate 20 may include the source 201 and the drain 202. The semiconductor device may further include the gate structure 21 on the substrate 20, where the source 201 and the drain 202 are respectively located on two sides of the gate structure 21. The semiconductor device may further include a first inter-layer dielectric layer 31 covering the gate structure 21; the source contact hole 301 running through the first inter-layer dielectric layer 31 and exposing the source 201 and the drain contact hole 302 running through the first inter-layer dielectric layer 31 and exposing the drain 202; and the source contact member 501 connected to the source 201 in the source contact hole 301 and the drain contact member 502 connected to the drain 202 in the drain contact hole 302. The semiconductor device may further include the air gap 60 between the gate structure 21 and the source contact member 501 or between the gate structure 21 and the drain contact member 502. The semiconductor device may further include a gate spacer layer 45 at least on a side wall of the air gap 60. The semiconductor device may further include the second inter-layer dielectric layer 32 on the first inter-layer dielectric layer 31, the source contact member 501, and the drain contact member 502, where the second inter-layer dielectric layer 32 covers the air gap 60.

Other forms of a semiconductor device according to the present disclosure are provided. In the semiconductor device, the gate spacer layer is formed on side surfaces of the gate structure, the source contact member, and the drain contact member. The air gap is between a part of the gate spacer layer on the side surface of the gate structure and a part of the gate spacer layer on the side surface of the source contact member or between a part of the gate spacer layer on the side surface of the gate structure and a part of the gate spacer layer on the side surface of the drain contact member. The gate spacer layer can avoid a potential short circuit connection caused by that a gate layer and the source contact member or the drain contact member are exposed by the air gap as far as possible.

In some implementations, similar to the semiconductor device shown in FIG. 9, the semiconductor device shown in FIG. 11 may further include the gate structures 22 and 23, and the initial spacer layer 24. For descriptions of these structures, refer to the foregoing descriptions, and no further details are provided herein.

In some implementations, as shown in FIG. 11, the gate structure 21 (or 22 or 23) may include the gate insulation material layer 211 on the substrate 20, the gate layer 212 on the gate insulation material layer 211, and the hard mask layer 213 on the gate layer 212.

In some implementations, the semiconductor device may further include a gate contact member running through the second inter-layer dielectric layer, the first inter-layer dielectric layer, and the hard mask layer and connected to the gate layer, where the gate contact member is spaced apart from the air gap in a horizontal direction (which is not shown in FIG. 11 and is described in detail below with reference to FIG. 22A to FIG. 22C).

In some implementations, in the step of forming the spacer structure layer, the spacer structure layer may further include a first spacer layer between the gate structure and the sacrificial spacer layer. The first spacer layer is formed on the exposed side surface of the at least one side of the gate structure, and the sacrificial spacer layer is formed on a side surface of the first spacer layer. The material of the sacrificial spacer layer is different from the material of the first spacer layer. In some implementations, the step of removing the sacrificial spacer layer to form the air gap may include selectively removing the sacrificial spacer layer and maintaining the first spacer layer.

FIG. 12 to FIG. 16 are exemplary cross-sectional views of structures in several stages in a process of manufacturing the semiconductor device. Forms of a process of manufacturing a semiconductor device are described in detail below with reference to FIG. 12 to FIG. 16.

Figure 12:
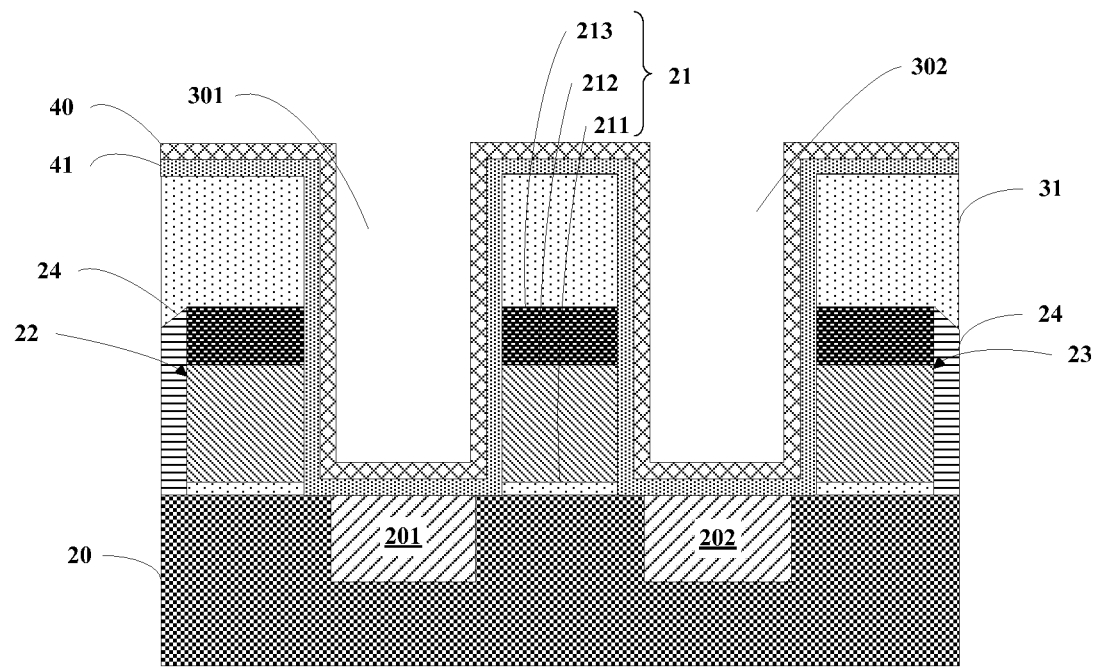
FIG. 12 is an exemplary cross-sectional view of a structure in a stage of a process of manufacturing a semiconductor device.

In some implementations, after the exposed part of the initial spacer layer is removed to expose the side surface of the at least one side of the gate structure (referring to FIG. 4, side surfaces of the two sides of the gate structure 21 and a side surface of one side of each of the gate structures 22 and 23 being exposed) is removed as shown in FIG. 12, the first spacer layer 41 is deposited on the structure shown in FIG. 4 and the sacrificial spacer layer 40 is deposited on the first spacer layer 41 using, for example, the atomic layer deposition process. The first spacer layer 41 and the sacrificial spacer layer 40 together serve as the spacer structure layer. The material of the sacrificial spacer layer 40 is different from the material of the first spacer layer 41. For example, the material of the first spacer layer 41 may include SiN, SiON, or SiOCN, and the material of the sacrificial spacer layer 40 may include polysilicon or amorphous silicon.

Figure 13:
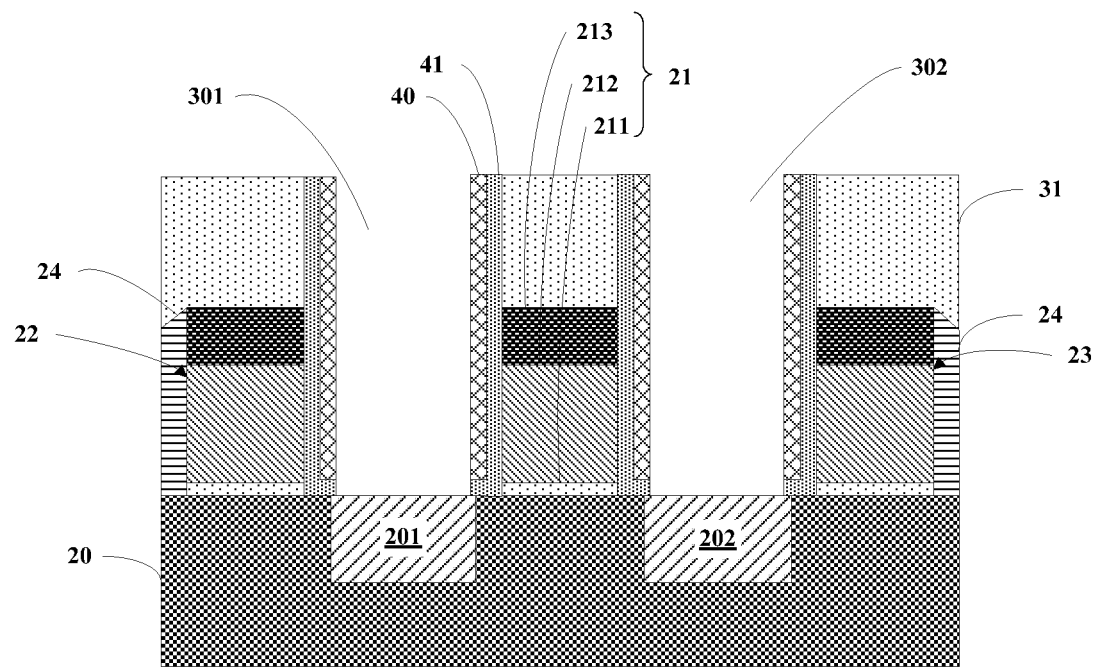
FIG. 13 is an exemplary cross-sectional view of a structure in a stage of a process of manufacturing a semiconductor device.

Subsequently, as shown in FIG. 13, for example, the spacer structure layer is etched using a dry etching process to remove a part of the spacer structure layer on the bottoms of the source contact hole 301 and the drain contact hole 302, and on the top surface of the first inter-layer dielectric layer 31 (a part of the first spacer layer 41 and a part of the sacrificial spacer layer 40 being removed in this embodiment), and a part of the spacer structure layer on side walls of the source contact hole 301 and the drain contact hole 302 is maintained, so as to form the spacer structure layer on the exposed side surface of the at least one side of the gate structure. For example, the spacer structure layer is formed on the two exposed side surfaces of the two sides of the gate structure. The spacer structure layer may include the first spacer layer 41 formed on the exposed side surface of the at least one side (for example, two sides) of the gate structure (for example, the gate structures 21, 22, or 23) and the sacrificial spacer layer 40 formed on a side surface of the first spacer layer 41.

Figure 14:
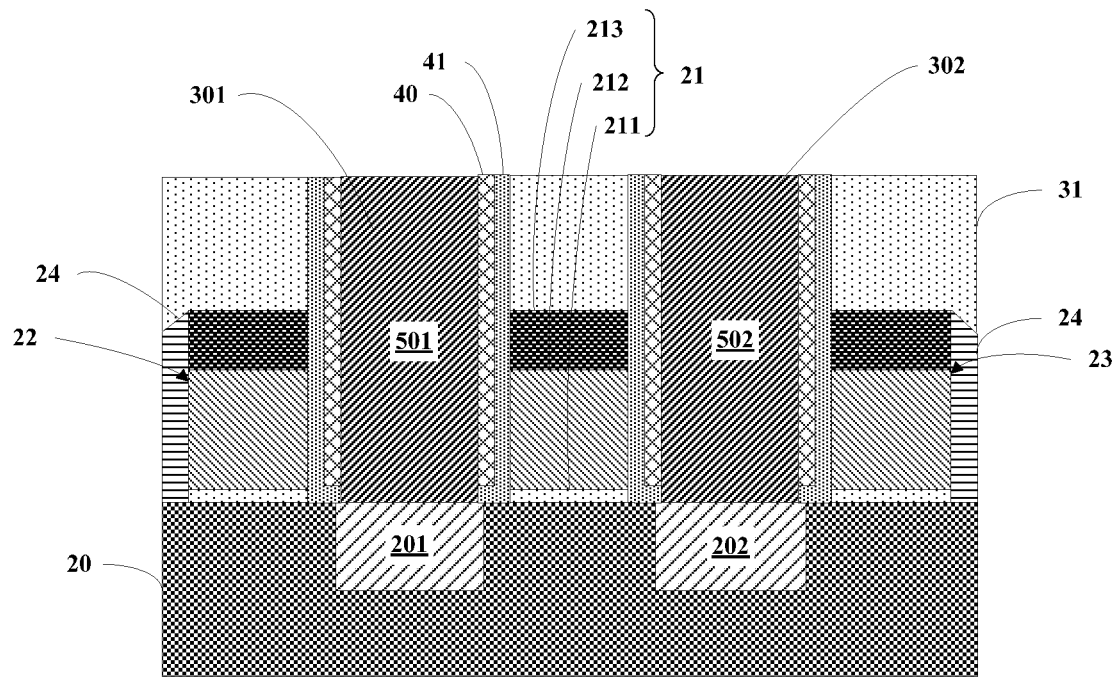
FIG. 14 is an exemplary cross-sectional view of a structure in a stage of a process of manufacturing a semiconductor device.

Subsequently, as shown in FIG. 14, the source contact member 501 connected to the source 201 is formed in the source contact hole 301 and the drain contact member 502 connected to the drain 202 is formed in the drain contact hole 302.

Figure 15:
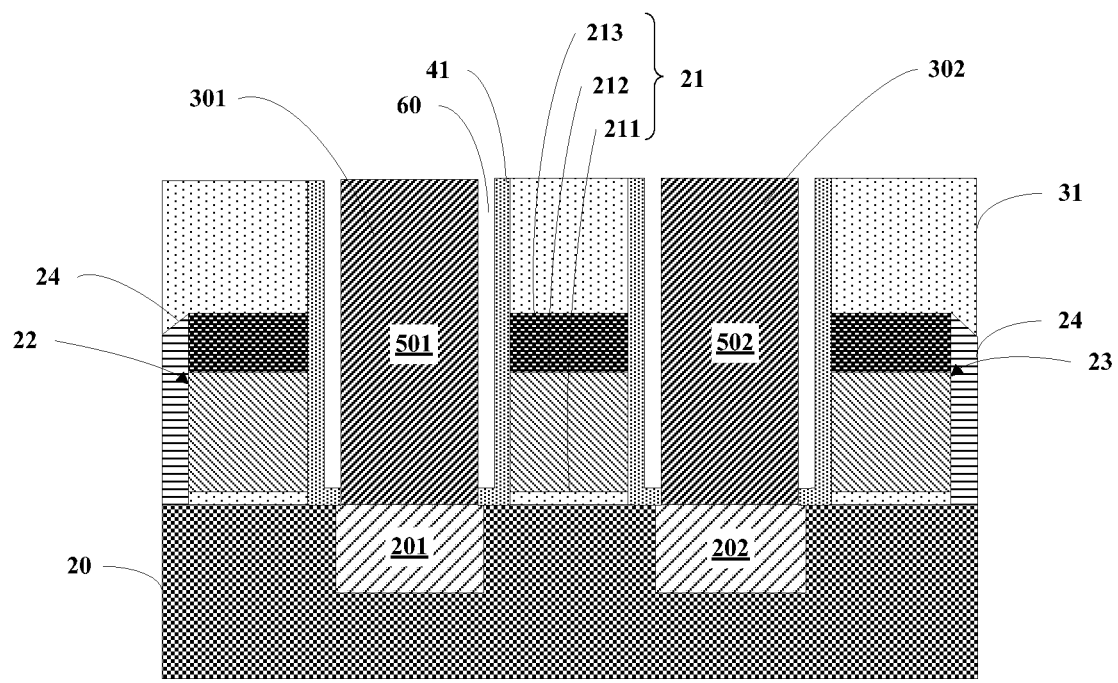
FIG. 15 is an exemplary cross-sectional view of a structure in a stage of a process of manufacturing a semiconductor device.

Subsequently, as shown in FIG. 15, at least a part of the spacer structure layer is selectively removed. In this implementation, that is, the sacrificial spacer layer 40 is selectively removed and the first spacer layer 41 is maintained, so as to form the air gap 60.

Figure 16:
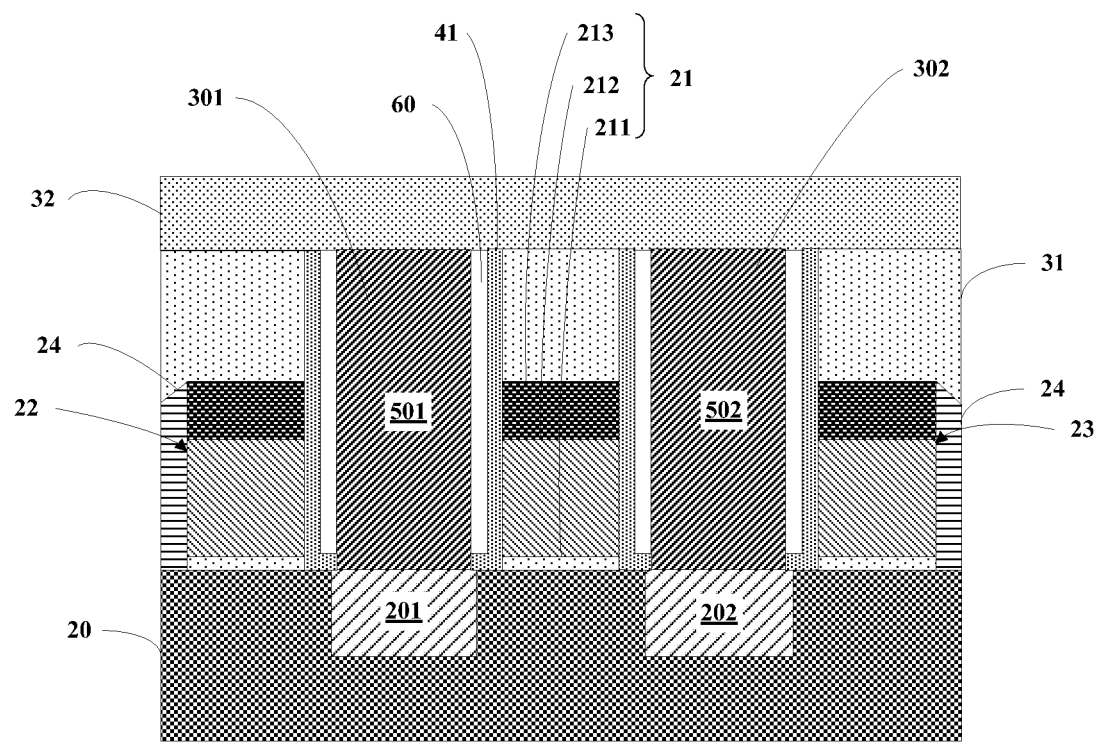
FIG. 16 is an exemplary cross-sectional view of a structure in a stage of a process of manufacturing a semiconductor device.

Subsequently, as shown in FIG. 16, for example, the second inter-layer dielectric layer 32 is non-conformally deposited on the first inter-layer dielectric layer 31, the source contact member 501, and the drain contact member 502 by using the CVD process, where the second inter-layer dielectric layer 32 covers the air gap 60.

Forms of a method for manufacturing a semiconductor device according to the present disclosure are provided. In the forms of the manufacturing method, the first spacer layer may be formed on the side surface of the gate structure, and the air gap is located between the first spacer layer and the source contact member or the drain contact member. In this way, a potential short circuit connection caused by the gate layer of the gate structure and the source contact member or the drain contact member through exposure to the air gap may be avoided.

As a result of forms of the foregoing manufacturing method, a semiconductor device is formed. As shown in FIG. 16, the semiconductor device may include the substrate 20 and the substrate 20 may include the source 201 and the drain 202. The semiconductor device may further include the gate structure 21 on the substrate 20, where the source 201 and the drain 202 are respectively located on two sides of the gate structure 21. The semiconductor device may further include the first spacer layer 41 on the side surface of the gate structure 21. The semiconductor device may further include the first inter-layer dielectric layer 31 covering the gate structure 21; the source contact hole 301 running through the first inter-layer dielectric layer 31 and exposing the source 201 and the drain contact hole 302 running through the first inter-layer dielectric layer 31 and exposing the drain 202; and the source contact member 501 connected to the source 201 in the source contact hole 301 and the drain contact member 502 connected to the drain 202 in the drain contact hole 302. The semiconductor device may further include the air gap 60 between the first spacer layer 41 and the source contact member 501 or between the first spacer layer 41 and the drain contact member 502. The semiconductor device may further include the second inter-layer dielectric layer 32 on the first inter-layer dielectric layer 31, the source contact member 501, and the drain contact member 502, where the second inter-layer dielectric layer 32 covers the air gap 60.

In some implementations, similar to the semiconductor device shown in FIG. 9, the semiconductor device shown in FIG. 16 may further include the gate structures 22 and 23, and the initial spacer layer 24. For descriptions of these structures, refer to the foregoing descriptions, and no further details are provided herein.

In some implementations, as shown in FIG. 16, the gate structure 21 (or 22 or 23) may include the gate insulation material layer 211 on the substrate 20, the gate layer 212 on the gate insulation material layer 211, and the hard mask layer 213 on the gate layer 212.

In some implementations, the semiconductor device may further include a gate contact member running through the second inter-layer dielectric layer, the first inter-layer dielectric layer, and the hard mask layer and connected to the gate layer, where the gate contact member is spaced apart from the air gap in a horizontal direction (which is not shown in FIG. 16 and is described in detail below with reference to FIG. 22A to FIG. 22C).

In some implementations, in the step of forming the spacer structure layer, the spacer structure layer may further include a second spacer layer on a side surface of the sacrificial spacer layer. The material of the sacrificial spacer layer is further different from the material of the second spacer layer. In some implementations, in the step of selectively removing the sacrificial spacer layer, the second spacer layer is further maintained.

FIG. 17 to FIG. 21 are exemplary cross-sectional views of structures in several stages in a process of manufacturing a semiconductor device. A process of manufacturing a semiconductor device according to still another implementations of the present disclosure is described in detail below with reference to FIG. 17 to FIG. 21.

Figure 17:
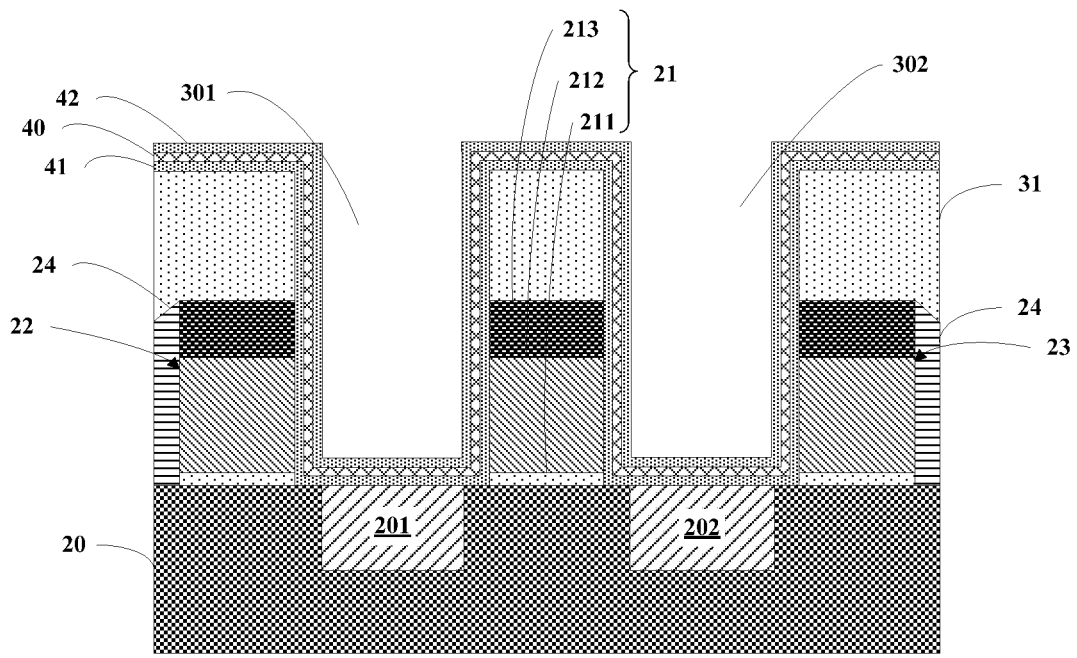
FIG. 17 is an exemplary cross-sectional view of a structure in a stage of a process of manufacturing a semiconductor device.

In some implementations, after the exposed part of the initial spacer layer is removed to expose the side surface of the at least one side of the gate structure (referring to FIG. 4, side surfaces of the two sides of the gate structure 21 and a side surface of one side of each of the gate structures 22 and 23 being exposed) is removed as shown in FIG. 17, the first spacer layer 41 is deposited on the structure shown in FIG. 4 and the sacrificial spacer layer 40 is deposited on the first spacer layer 41, and the second spacer layer 42 is deposited on the sacrificial spacer layer 40 by using, for example, the atomic layer deposition process. The first spacer layer 41, the sacrificial spacer layer 40, and the second spacer layer 42 together serve as the spacer structure layer. The material of the sacrificial spacer layer 40 is different from the material of the first spacer layer 41, and the material of the sacrificial spacer layer 40 is also different from the material of the second spacer layer 42. For example, the materials of the first spacer layer 41 and the second spacer layer 42 may respectively include SiN, SiON, or SiOCN, and the material of the sacrificial spacer layer 40 may include polysilicon or amorphous silicon.

Figure 18:
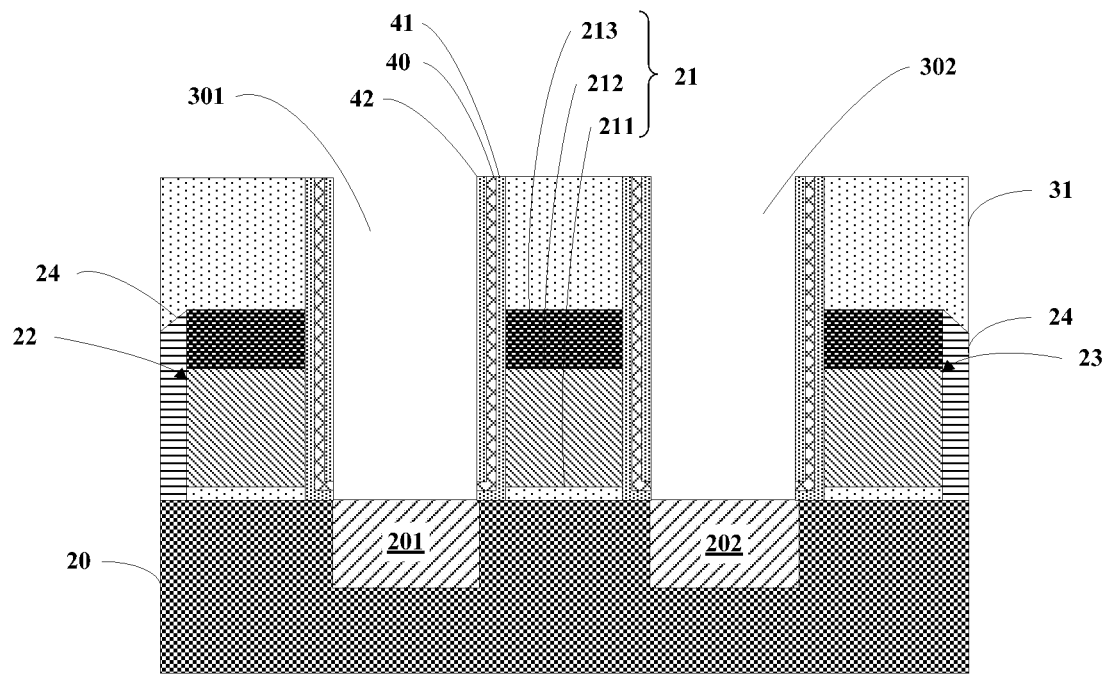
FIG. 18 is an exemplary cross-sectional view of a structure in a stage of a process of manufacturing a semiconductor device.

Subsequently, as shown in FIG. 18, for example, the spacer structure layer is etched by using a dry etching process to remove a part of the spacer structure layer on the bottoms of the source contact hole 301 and the drain contact hole 302, and on the top surface of the first inter-layer dielectric layer 31 (a part of the first spacer layer 41, a part of the sacrificial spacer layer 40, and a part of the second spacer layer 42 being removed in this implementation), and a part of the spacer structure layer on side walls of the source contact hole 301 and the drain contact hole 302 is maintained, so as to form the spacer structure layer on the exposed side surface of the at least one side of the gate structure. For example, the spacer structure layer is formed on the two exposed side surfaces of the two sides of the gate structure. The spacer structure layer may include the first spacer layer 41 formed on the exposed side surface of the at least one side (for example, two sides) of the gate structure (for example, the gate structures 21, 22, or 23), the sacrificial spacer layer 40 formed on a side surface of the first spacer layer 41, and the second spacer layer 42 formed on a side surface of the sacrificial spacer layer 40.

Figure 19:
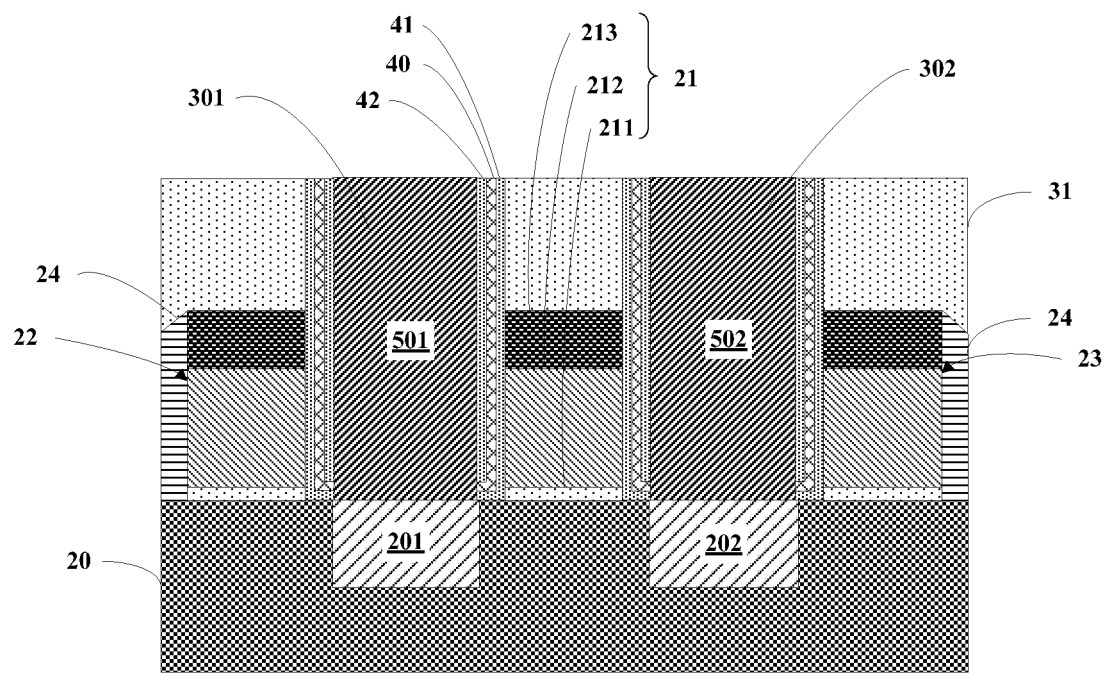
FIG. 19 is an exemplary cross-sectional view of a structure in a stage of a process of manufacturing a semiconductor device.

Subsequently, as shown in FIG. 19, the source contact member 501 connected to the source 201 is formed in the source contact hole 301 and the drain contact member 502 connected to the drain 202 is formed in the drain contact hole 302.

Figure 20:
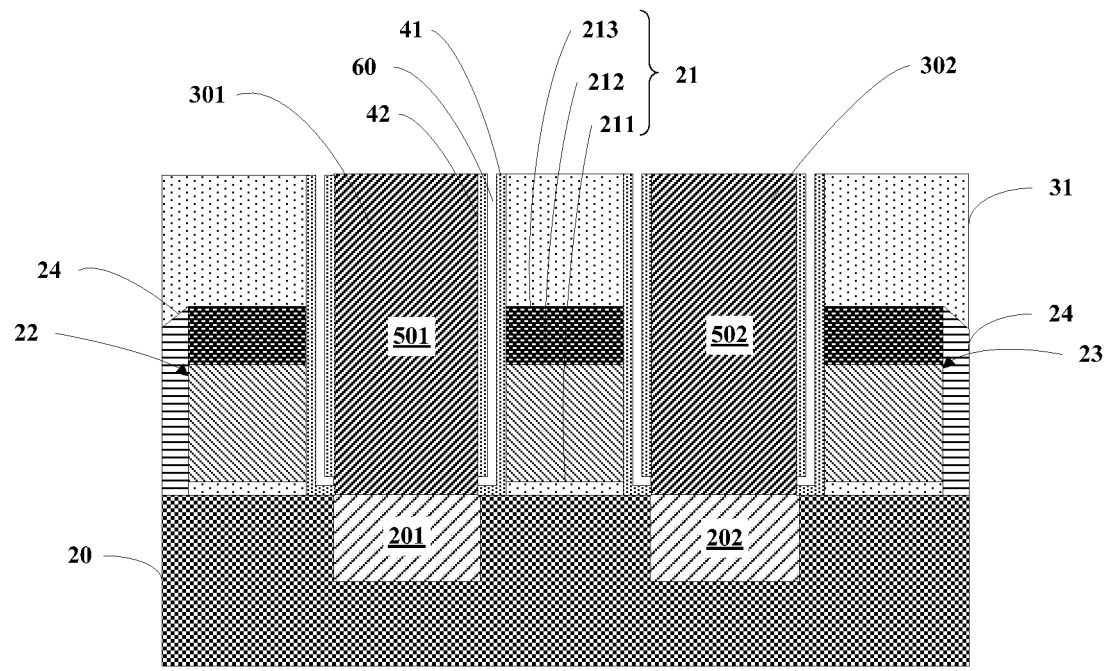
FIG. 20 is an exemplary cross-sectional view of a structure in a stage of a process of manufacturing a semiconductor device.

Subsequently, as shown in FIG. 20, at least a part of the spacer structure layer is selectively removed. In this implementation, that is, the sacrificial spacer layer 40 is selectively removed, and the first spacer layer 41 and the second spacer layer 42 are maintained, so as to form the air gap 60.

Figure 21:
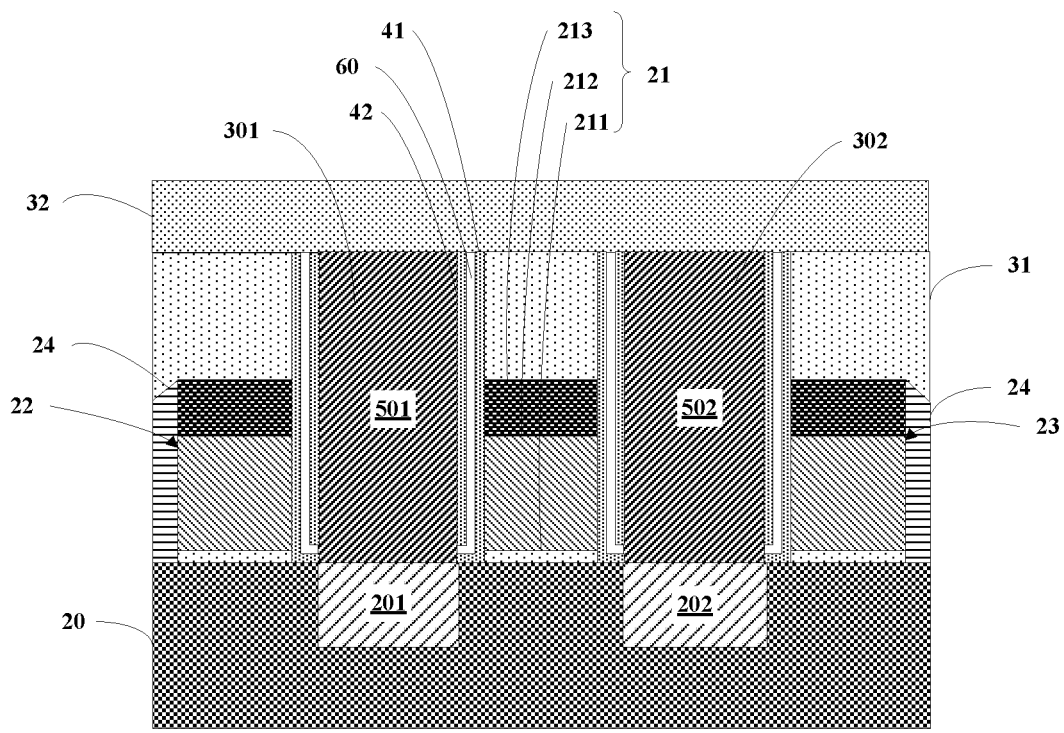
FIG. 21 is an exemplary cross-sectional view of a structure in a stage of a process of manufacturing a semiconductor device.

Subsequently, as shown in FIG. 21, for example, the second inter-layer dielectric layer 32 is non-conformally deposited on the first inter-layer dielectric layer 31, the source contact member 501, and the drain contact member 502 by using the CVD process, where the second inter-layer dielectric layer 32 covers the air gap 60.

Forms of a method for manufacturing a semiconductor device according to other implementations of the present disclosure are provided. In the forms of the manufacturing method, the first spacer layer and the second spacer layer are formed. The air gap is located between the first spacer layer and the second spacer layer, where the first spacer layer is located on the side surface of the gate structure, and the second spacer layer is located on a side surface of the source contact member or the drain contact member. In this way, a potential short circuit connection caused by the gate layer of the gate layer and the source contact member or the drain contact member through exposure to the air gap may be avoided.

As a result of the foregoing manufacturing method, a semiconductor device is formed. As shown in FIG. 21, apart from the same or similar structures of the semiconductor device shown in FIG. 16, the semiconductor device may further include a second spacer layer 42 on side surfaces of the source contact member 501 or the drain contact member 502. The air gap 60 is between the first spacer layer 41 and the second spacer layer 42. Such a structure can avoid a potential short circuit connection caused by that the gate layer of the gate structure and the source contact member or the drain contact member are exposed by the air gap as far as possible.

Figure 22A:
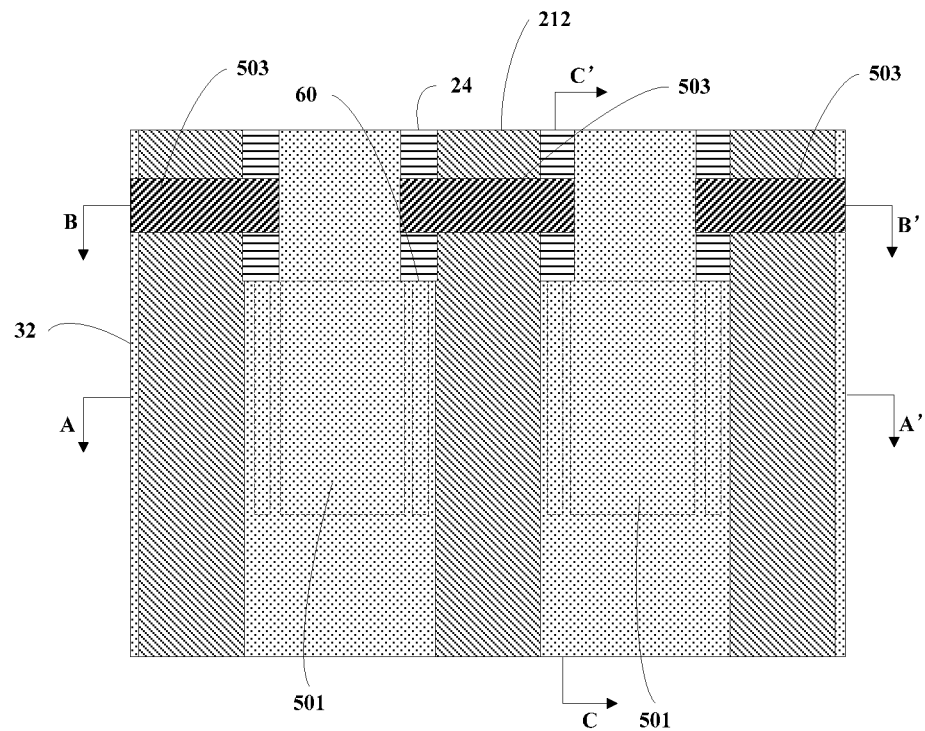
FIG. 22A is an exemplary top view of a structure in a stage of a process of manufacturing a semiconductor device.

FIG. 22A is an exemplary top view of a structure in a stage during manufacturing a semiconductor device. FIG. 22B is an exemplary cross-sectional view of the structure shown in FIG. 22A taken along line B-B'. FIG. 22C is an exemplary cross-sectional view of the structure shown in FIG. 22A taken along line C-C'. FIG. 21 is an exemplary cross-sectional view of the structure shown in FIG. 22A taken along line A-A'.

Figure 22B:
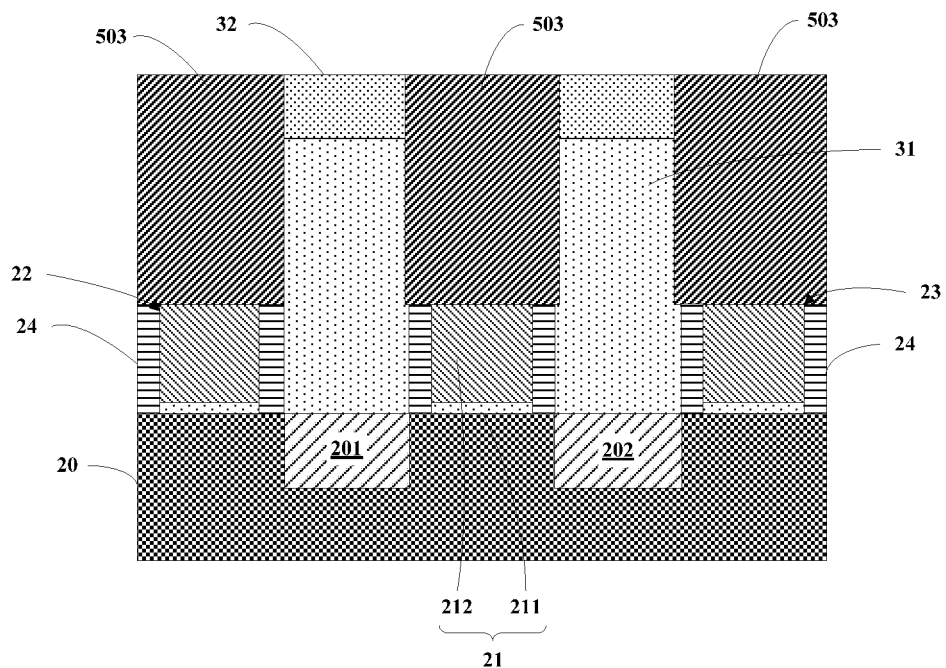
FIG. 22B is an exemplary cross-sectional view of the structure shown in FIG. 22A taken along line B-B'.
Figure 22C:
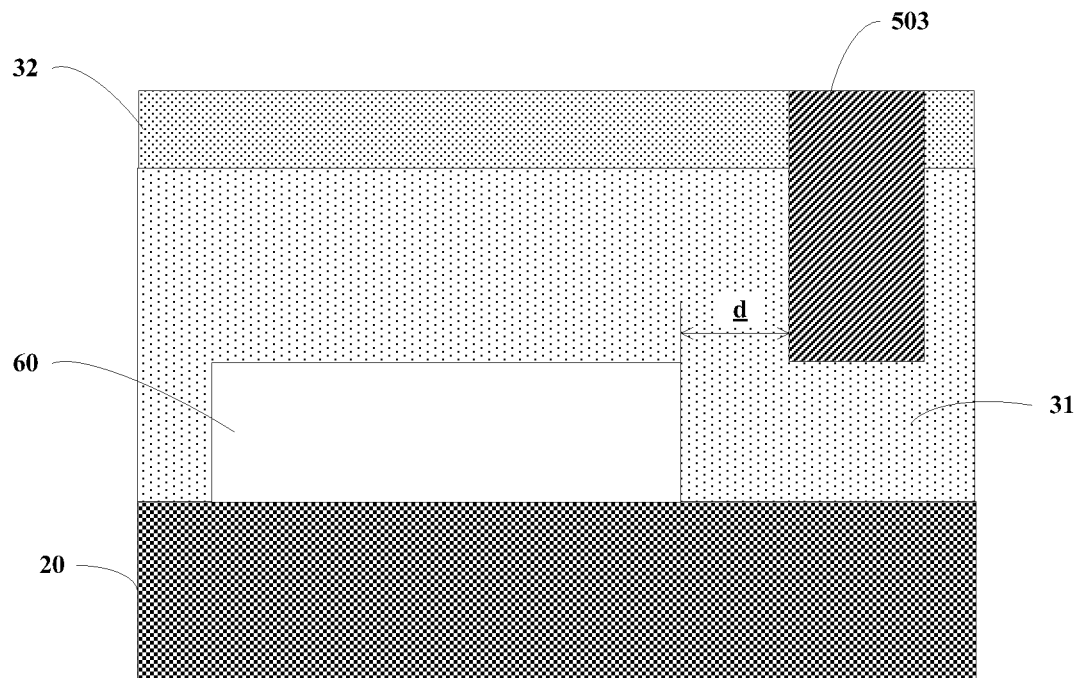
FIG. 22C is an exemplary cross-sectional view of the structure shown in FIG. 22A taken along line C-C'.

In some implementations, the foregoing manufacturing method may further include, as shown in FIG. 22A and FIG. 22B, forming a gate contact member 503 running through the second inter-layer dielectric layer 32, the first inter-layer dielectric layer 31, and the hard mask layer and connected to the gate layer 212. As shown in FIG. 22C, the gate contact member 503 is spaced apart from the air gap 60 in a horizontal direction. As shown in FIG. 22C, the spacing distance in a horizontal distance between the gate contact member 503 and the air gap 60 is d. For example, the spacing distance d may be in a range of 5 nm to 500 nm. For example, the spacing distance d may be 10 nm, 50 nm, 100 nm, 300 nm, or the like. The gate contact member is spaced apart from the air gap in the horizontal direction, and the gate contact member is not formed right above the air gap. Therefore, the gate contact member is unlikely to enter the air gap and lead to an unexpected gate defect (for example, a short circuit contact between the gate and other structures).

It should be noted that, for convenience of presenting, parts of the hard mask layer, the first inter-layer dielectric layer 31, and the second inter-layer dielectric layer 32 that are on the gate layer 212 are not shown in FIG. 22A, but a person skilled in the art will understand how to implement the technical solution disclosed herein.

It should be further noted that, as shown in FIG. 22A and FIG. 22B, in a process of forming the air gap 60, a part of the initial spacer layer 24 on two ends of the air gap 60 may be maintained.

It should be further noted that, apart from the manufacturing step of the semiconductor device shown in FIG. 21, the foregoing forming step of the gate contact member is also applicable to manufacturing steps of the semiconductor device shown in FIG. 9, FIG. 11, and FIG. 16.

In some implementations, the step of forming a gate contact member may include etching the second inter-layer dielectric layer, the first inter-layer dielectric layer, and the hard mask layer to form a gate contact hole exposing the gate layer, and then forming, in the gate contact hole, the gate contact member connected to the gate layer.

As a result of the foregoing manufacturing method, a semiconductor device is formed. As shown in FIG. 21, FIG. 22A, FIG. 22B, and FIG. 22C, the semiconductor device further includes the gate contact member 503 running through the second inter-layer dielectric layer 32, the first inter-layer dielectric layer 31, and the hard mask layer 213 and connected to the gate layer 212, where the gate contact member 503 is spaced apart from the air gap 60 in a horizontal direction.

FIG. 23 to FIG. 29 are exemplary cross-sectional views of structures in several stages in a process manufacturing a semiconductor device. A process of manufacturing a semiconductor device is described in detail below with reference to FIG. 23 to FIG. 29.

Figure 23:
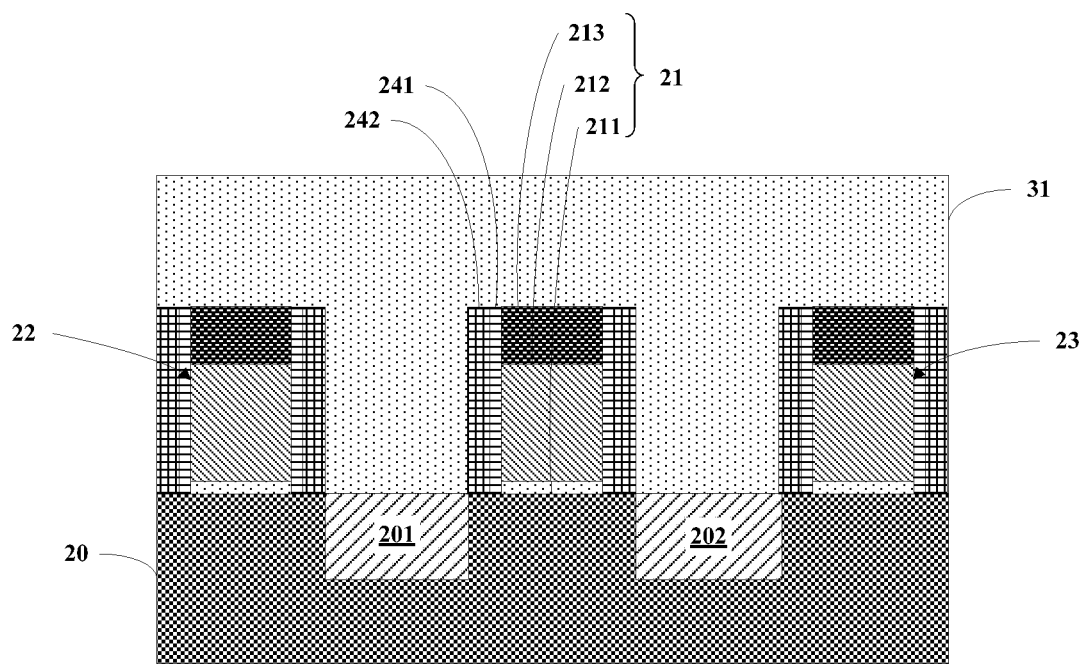
FIG. 23 is an exemplary cross-sectional view of a structure in a stage of a process of manufacturing a semiconductor device.

First, as shown in FIG. 23, the semiconductor structure is provided. The semiconductor structure may include the substrate 20, the gate structure 21 (22 or 23) on the substrate 20, the first initial spacer layers 241 on the side surfaces of two sides of the gate structure, the second initial spacer layers 242 on the side surfaces of the first initial spacer layers 241, and the first inter-layer dielectric layer 31 covering the gate structure, the first initial spacer layer 241, and the second initial spacer layer 242. The substrate 20 may include the source 201 and the drain 202 respectively located on the two sides of the gate structure 21. The material of the first initial spacer layer 241 is different from the material of the second initial spacer layer 242. For example, the material of the first initial spacer layer 241 may include SiN, and the material of the second initial spacer layer 242 may include SiON, SiO$_2$, SiOCN, or the like.

In some implementations, the gate structure 21 (or 22 or 23) may include the gate insulation material layer 211 on the substrate 20, the gate layer 212 on the gate insulation material layer 211, and the hard mask layer 213 on the gate layer 212.

Figure 24:
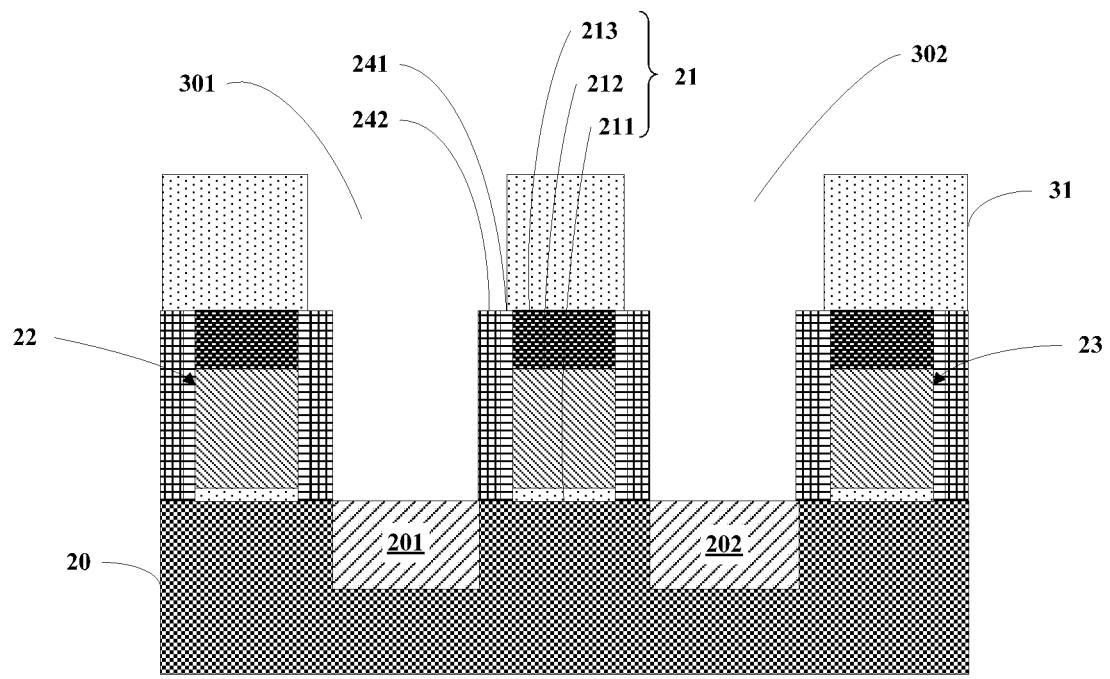
FIG. 24 is an exemplary cross-sectional view of a structure in a stage of a process of manufacturing a semiconductor device.

Subsequently, as shown in FIG. 24, the first inter-layer dielectric layer 31 is etched to form the source contact hole 301 exposing the source 201 and the drain contact hole 302 exposing the drain 202. The source contact hole 301 and the drain contact hole 302 further expose a part of the second initial spacer layer 242 on a side surface of the first initial spacer layer 241 on at least one side of the gate structure 21 (or 22 or 23).

Figure 25:
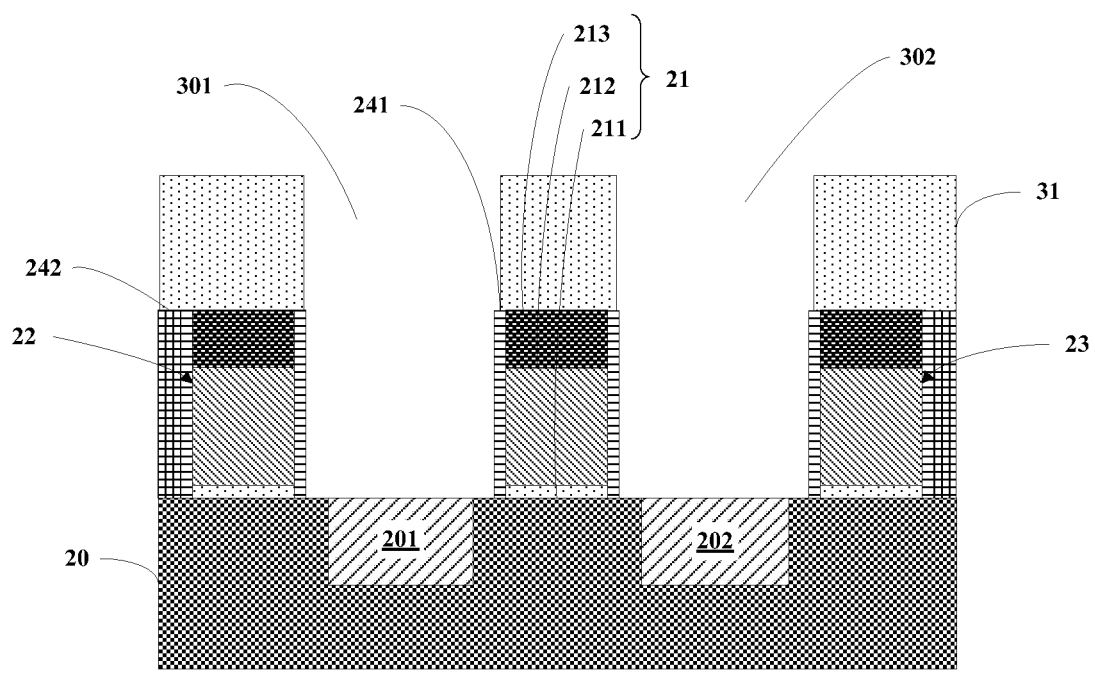
FIG. 25 is an exemplary cross-sectional view of a structure in a stage of a process of manufacturing a semiconductor device.

Subsequently, as shown in FIG. 25, the exposed part of the second initial spacer layer 242 is removed to expose the side surface of the first initial spacer layer 241.

Figure 26:
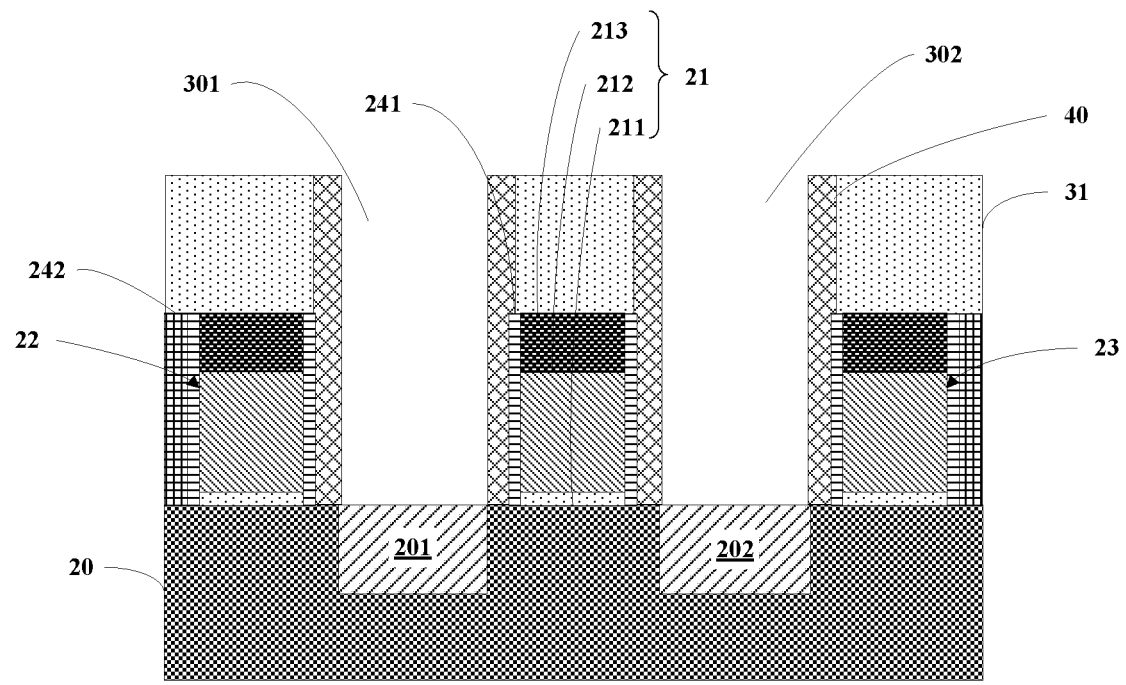
FIG. 26 is an exemplary cross-sectional view of a structure in a stage of a process of manufacturing a semiconductor device.

Subsequently, as shown in FIG. 26, the spacer structure layer is formed on the exposed side surface of the first initial spacer layer 241. For example, as shown in FIG. 6, in the step of forming the spacer structure layer, the spacer structure layer may include the sacrificial spacer layer 40 on the exposed side surface of the first initial spacer layer 241.

Figure 27:
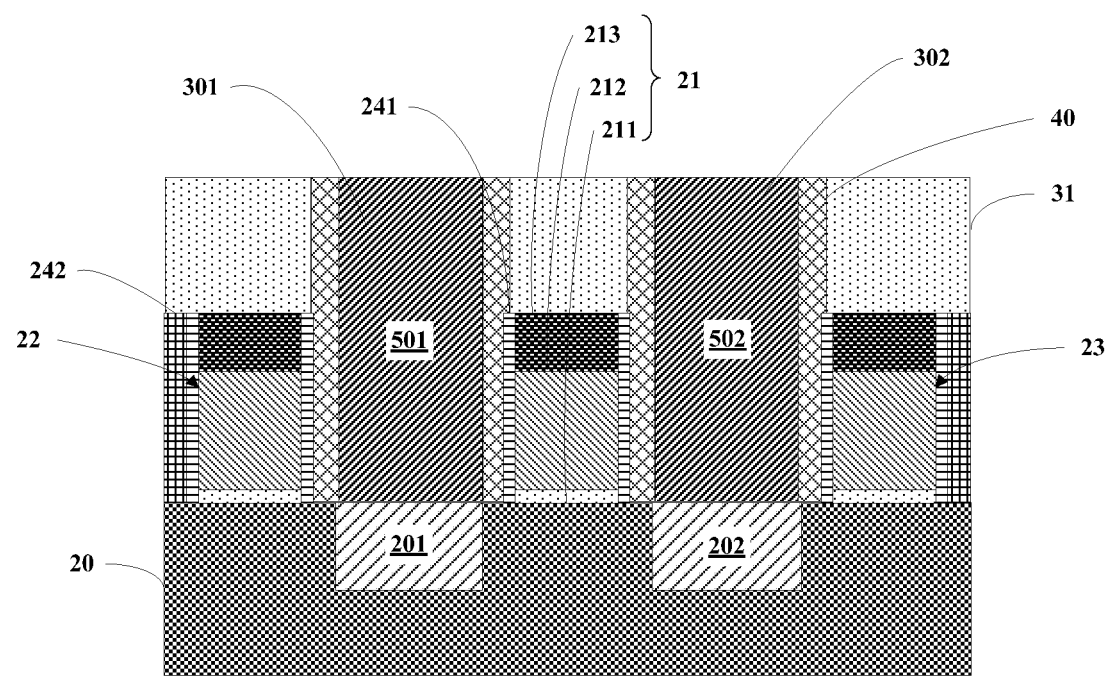
FIG. 27 is an exemplary cross-sectional view of a structure in a stage of a process of manufacturing a semiconductor device.

Subsequently, as shown in FIG. 27, the source contact member 501 connected to the source 201 is formed in the source contact hole 301 and the drain contact member 502 connected to the drain 202 is formed in the drain contact hole 302.

Figure 28:
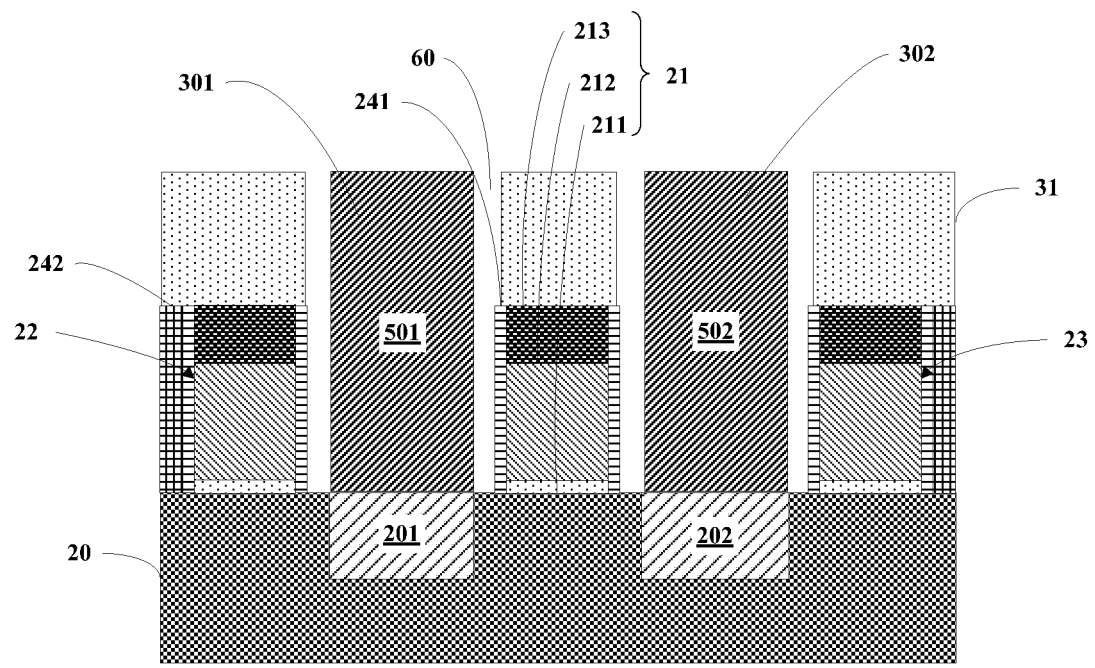
FIG. 28 is an exemplary cross-sectional view of a structure in a stage of a process of manufacturing a semiconductor device.

Subsequently, as shown in FIG. 28, at least a part of the spacer structure layer is selectively removed to form an air gap 60. For example, the sacrificial spacer layer 40 is removed to form the air gap 60.

Figure 29:
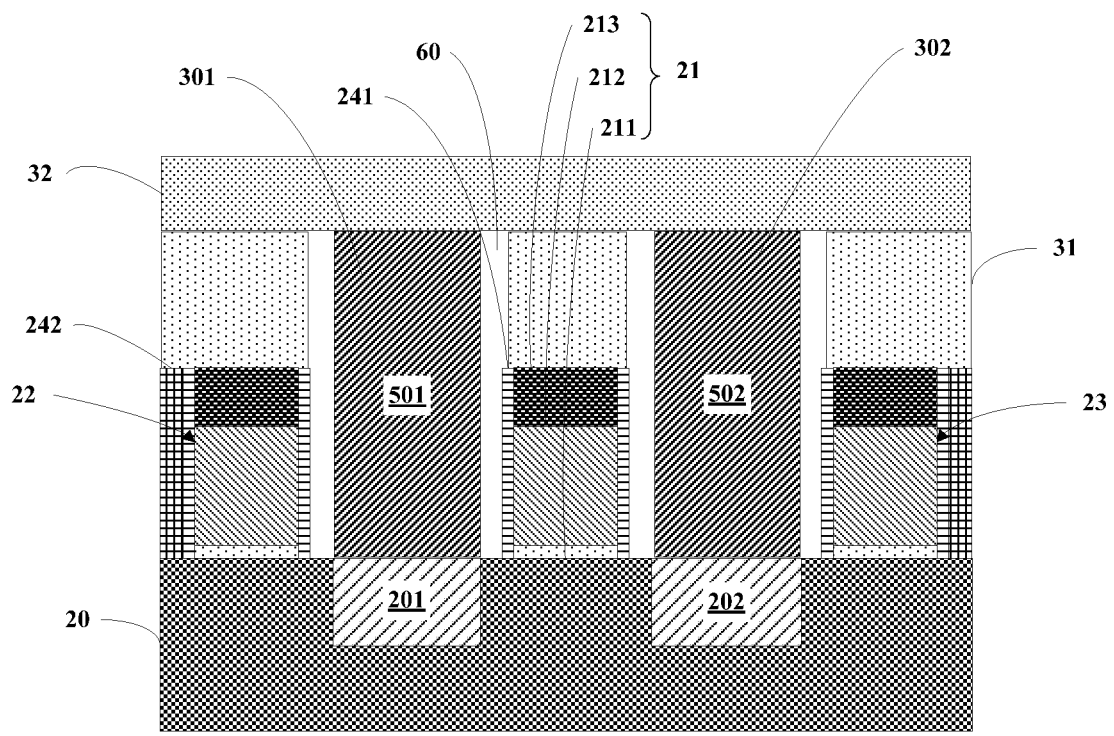
FIG. 29 is an exemplary cross-sectional view of a structure in a stage of a process of manufacturing a semiconductor device.

Subsequently, as shown in FIG. 29, the second inter-layer dielectric layer 32 is formed on the first inter-layer dielectric layer 31, the source contact member 501, and the drain contact member 502, where the second inter-layer dielectric layer 32 covers the air gap 60.

Forms of a method for manufacturing a semiconductor device are provided. In forms of the foregoing manufacturing method, the air gap is formed between the gate structure and the source contact member or between the gate structure and the drain contact member, so that the air gap spacer structure is formed and parasitic capacitance is reduced. In addition, because one side of the air gap has the first initial spacer layer, a problem that the gate layer is in short circuit connection with the source contact member or the drain contact member may be avoided as far as possible.

In some implementations, similar to the foregoing descriptions, before the second inter-layer dielectric layer is formed, the manufacturing method may further include conformally depositing a gate spacer layer at least on a side wall of the air gap. In this way, a problem that the gate layer is in short circuit connection with the source contact member or the drain contact member may be further avoided as far as possible.

In some implementations, similar to the foregoing descriptions, in the step of forming the spacer structure layer, the a spacer structure layer may include a first spacer layer on the exposed side surface of the first initial spacer layer and the sacrificial spacer layer on a side surface of the first spacer layer. The material of the sacrificial spacer layer is different from the material of the first spacer layer. The step of selectively removing at least a part of the spacer structure layer to form an air gap may include selectively removing the sacrificial spacer layer and maintaining the first spacer layer.

In some implementations, similar to the foregoing descriptions, in the step of forming the spacer structure layer, apart from the first spacer layer and the sacrificial spacer layer, the spacer structure layer may further include a second spacer layer on a side surface of the sacrificial spacer layer. The material of the sacrificial spacer layer is further different from the material of the second spacer layer. In the step of selectively removing the sacrificial spacer layer, the second spacer layer is further maintained.

As a result of the foregoing manufacturing method, a semiconductor device is formed. For example, as shown in FIG. 29, the semiconductor device may include the substrate 20. The substrate 20 may include the source 201 and the drain 202. The semiconductor device may further include the gate structure 21 on the substrate 20, where the source 201 and the drain 202 are respectively located on two sides of the gate structure 21. The semiconductor device may further include the first initial spacer layer 241 on the side surface of the gate structure 21. The semiconductor device may further include the first inter-layer dielectric layer 31 covering the gate structure; the source contact hole 301 running through the first inter-layer dielectric layer 31 and exposing the source 201 and the drain contact hole 302 running through the first inter-layer dielectric layer 31 and exposing the drain 202; and the source contact member 501 connected to the source 201 in the source contact hole 301 and the drain contact member 502 connected to the drain 202 in the drain contact hole 302. The semiconductor device may further include the air gap 60 between the first initial spacer layer 241 and the source contact member 501 or between the first initial spacer layer 241 and the drain contact member 502. The semiconductor device may further include the second inter-layer dielectric layer 32 on the first inter-layer dielectric layer 31, the source contact member 501, and the drain contact member 502, where the second inter-layer dielectric layer 32 covers the air gap 60.

In some implementations of the semiconductor device, the air gap is formed between the gate structure and the source contact member or between the gate structure and the drain contact member, so that an air gap spacer structure is formed and parasitic capacitance is reduced. In addition, because one side of the air gap has the first initial spacer layer, a problem that the gate layer is in short circuit connection with the source contact member or the drain contact member may be avoided.

Above, methods for manufacturing a semiconductor device and the formed semiconductor device according to the present disclosure are described in detail. To avoid obscuring the concept of the present disclosure, some details known in the art are not described. Based on the foregoing descriptions, a person skilled in the art will understand how to implement the technical solution disclosed herein.

Although some particular embodiments and implementations of the present disclosure have been described in detail by using examples, a person skilled in the art will understand that the above examples are merely for the purpose of illustration and are not intended to limit the scope of the present disclosure. A person skilled in the art will understand that the above embodiments and implementations may be modified without departing from the scope and spirit of the present disclosure. The scope of the present disclosure is defined by the appended claims.

What is claimed is:

1. A semiconductor device, comprising:
   a substrate, comprising a source and a drain;
   a gate structure disposed on the substrate, wherein the source and the drain are respectively located on two sides of the gate structure;
   a first inter-layer dielectric layer covering the gate structure;
   a source contact hole running through the first inter-layer dielectric layer and exposing the source and a drain contact hole running through the first inter-layer dielectric layer and exposing the drain;
   a source contact member connected to the source in the source contact hole and a drain contact member connected to the drain in the drain contact hole;
   an air gap between the gate structure and the source contact member or between the gate structure and the drain contact member, wherein side walls of the air gap are a side wall of the gate structure and a side wall of the source contact member or a side wall of the gate structure and a side wall of the drain contact member; and
   a second inter-layer dielectric layer on the first inter-layer dielectric layer, the source contact member, and the drain contact member, wherein the second inter-layer dielectric layer covers the air gap, a top end of the air gap is level with a top surface of the first inter-layer dielectric layer and a bottom surface of the second inter-layer dielectric layer.

2. The semiconductor device according to claim 1, further comprising:
   a gate spacer layer at least on a side wall of the air gap.

3. The semiconductor device according to claim 1, wherein:
   the gate structure comprises a gate insulation material layer on the substrate, a gate layer on the gate insulation material layer, and a hard mask layer on the gate layer; and
   the semiconductor device further comprises a gate contact member running through the second inter-layer dielectric layer, the first inter-layer dielectric layer, and the hard mask layer and connected to the gate layer, the gate contact member being spaced apart from the air gap in a horizontal direction.

4. A semiconductor device, comprising:
   a substrate, comprising a source and a drain;
   a gate structure disposed on the substrate, wherein the source and the drain are respectively located on two sides of the gate structure;
   a first spacer layer on a side surface of the gate structure;
   a first inter-layer dielectric layer covering the gate structure;
   a source contact hole running through the first inter-layer dielectric layer and exposing the source and a drain contact hole running through the first inter-layer dielectric layer and exposing the drain;
   a source contact member connected to the source in the source contact hole and a drain contact member connected to the drain in the drain contact hole;
   a second spacer layer on a side surface of the source contact member or a side surface of the drain contact member, a bottom end of the second spacer layer is higher than a bottom end of the first spacer layer;
   an air gap between the first spacer layer and the second spacer layer, a bottom end of the air gap is positioned above the bottom end of the first spacer layer and below the bottom end of the second spacer layer; and
   a second inter-layer dielectric layer on the first inter-layer dielectric layer, the source contact member, and the drain contact member, wherein the second inter-layer dielectric layer covers the air gap.

5. The semiconductor device according to claim 4, wherein:
   the gate structure comprises a gate insulation material layer on the substrate, a gate layer on the gate insulation material layer, and a hard mask layer on the gate layer; and
   the semiconductor device further comprises a gate contact member running through the second inter-layer dielectric layer, the first inter-layer dielectric layer, and the hard mask layer and connected to the gate layer, the gate contact member being spaced apart from the air gap in a horizontal direction.

6. A semiconductor device, comprising:
   a substrate, comprising a source and a drain;
   a gate structure disposed on the substrate, wherein the source and the drain are respectively located on two sides of the gate structure;
   a first initial spacer layer on a side surface of the gate structure;
   a first inter-layer dielectric layer covering the gate structure;
   a source contact hole running through the first inter-layer dielectric layer and exposing the source and a drain contact hole running through the first inter-layer dielectric layer and exposing the drain;
   a source contact member connected to the source in the source contact hole and a drain contact member connected to the drain in the drain contact hole;
   an air gap between the first initial spacer layer and the source contact member or between the first initial spacer layer and the drain contact member; and
   a second inter-layer dielectric layer on the first inter-layer dielectric layer, the source contact member, and the drain contact member, wherein the second inter-layer dielectric layer covers the air gap, a top end of the air gap is level with a top surface of the first inter-layer dielectric layer and a bottom surface of the second inter-layer dielectric layer.

* * * * *